US006768755B2

(12) United States Patent
Inoue et al.

(10) Patent No.: US 6,768,755 B2
(45) Date of Patent: Jul. 27, 2004

(54) SEMICONDUCTOR LASER DEVICE

(75) Inventors: Daijiro Inoue, Kyoto (JP); Ryoji Hiroyama, Kyotanabe (JP); Kunio Takeuchi, Joyo (JP); Yasuhiko Nomura, Moriguchi (JP); Masayuki Hata, Kadoma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/746,065

(22) Filed: Dec. 26, 2000

(65) Prior Publication Data

US 2001/0006527 A1 Jul. 5, 2001

(30) Foreign Application Priority Data

Dec. 28, 1999 (JP) .............................. 11-374497
Mar. 29, 2000 (JP) ....................... 2000-092303

(51) Int. Cl.$^7$ ................. H01S 5/00; H01S 3/14
(52) U.S. Cl. ................. 372/43; 372/45; 372/46; 372/50; 372/68; 372/44
(58) Field of Search .................. 372/43, 45, 46, 372/44, 50, 68

(56) References Cited

U.S. PATENT DOCUMENTS

| 5,305,341 A | * | 4/1994 | Nishikawa et al. ........... 372/45 |
| 5,933,443 A | | 8/1999 | Mushiage et al. |
| 5,960,019 A | | 9/1999 | Hayashi et al. ............... 372/46 |
| 5,963,572 A | * | 10/1999 | Hiroyama et al. ............ 372/46 |
| 6,181,723 B1 | * | 1/2001 | Okubo et al. ................. 372/45 |

FOREIGN PATENT DOCUMENTS

| CN | 1169047 A | 12/1997 |
| JP | 8-222801 | 8/1996 |

OTHER PUBLICATIONS

Symposium on Optical Memory (SOM'94), paper P20, Tokyo, pp. 95–96, Jul., 1994.
Notice on Office Action in the counterpart Chinese application and translation.

* cited by examiner

Primary Examiner—Paul Ip
Assistant Examiner—Armando Rodriguez
(74) Attorney, Agent, or Firm—Westerman, Hattori, Daniels & Adrian, LLP

(57) ABSTRACT

A depletion enhancement layer having a striped opening on the upper surface of a ridge portion, a low carrier concentration layer and an n-type current blocking layer are successively formed on a p-type cladding layer having the ridge portion. The low carrier concentration layer has a lower carrier concentration than the n-type current blocking layer. The band gap of the depletion enhancement layer is set to an intermediate level between the band gaps of the p-type cladding layer and the low carrier concentration layer. Alternatively, a first current blocking layer having a low carrier concentration and a second current blocking layer of the opposite conduction type are formed on an n-type depletion enhancement layer, and a p-type contact layer is formed on the second current blocking layer of the opposite conduction type and another p-type contact layer.

25 Claims, 23 Drawing Sheets

F I G. 1 8
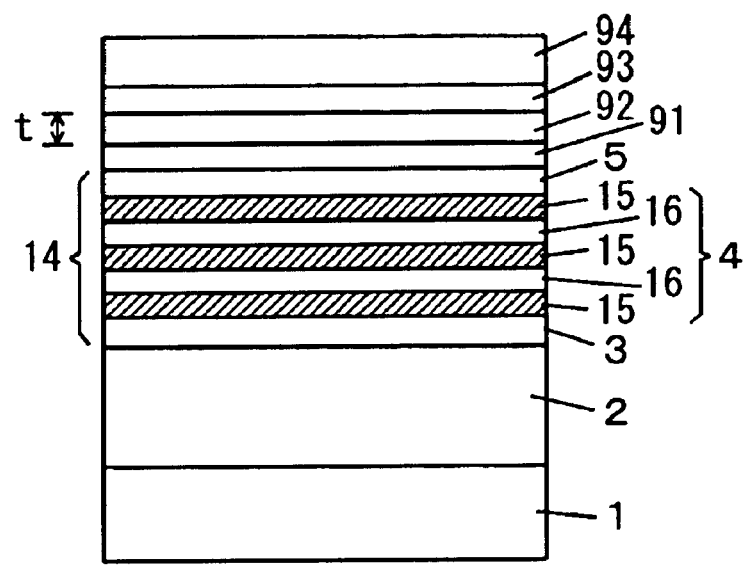
F I G. 1 9
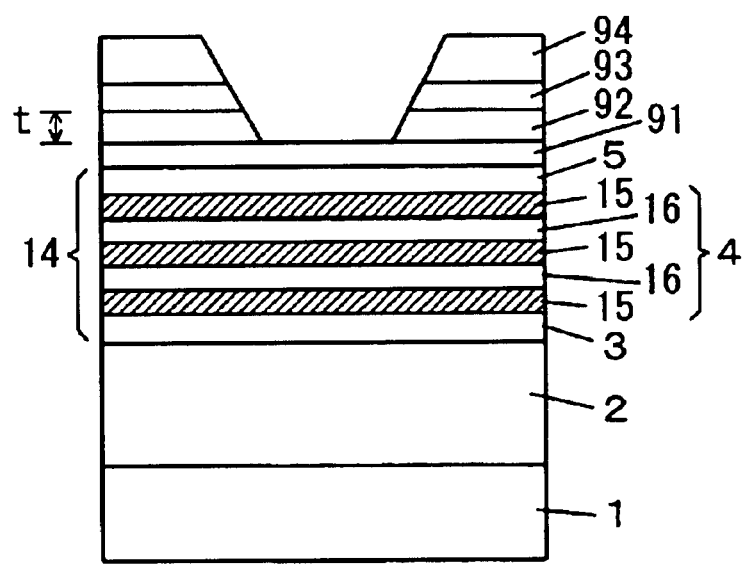

SEMICONDUCTOR LASER DEVICE

BACKGROUND OF THE INVENTION

1. Field of the Invention

The present invention relates to a semiconductor laser device having a current blocking layer.

2. Description of the Prior Art

A refractive index guided semiconductor laser device supplied with refractive index difference in a direction parallel to an active layer for forming a light guide is developed in general. FIG. 34 is a typical sectional view showing a conventional semiconductor laser device 120 described in Japanese Patent Laying-Open No. 8-222801 (1996).

In the semiconductor laser device 120 shown in FIG. 34, an n-type cladding layer 122, an active layer 123, a p-type cladding layer 124 and a p-type contact layer 127 are successively formed on an n-type substrate 121, and the p-type contact layer 127 and the p-type cladding layer 124 are etched for forming flat portions on a ridge portion and on both sides of the ridge portion.

Further, a first current blocking layer 125 having a low carrier concentration is formed on the flat portions of the p-type cladding layer 124 located on both sides of the ridge portion, and an n-type current blocking layer 126 is formed on the first current blocking layer 125 having a low carrier concentration. A p-type contact layer 128 is formed on the p-type contact layer 127 and the n-type current blocking layer 126.

When the semiconductor laser device 120 is driven, a reverse bias voltage is applied to a p-n junction between the n-type current blocking layer 126 and the p-type cladding layer 124. Thus, the n-type current blocking layer 126 cuts off a current so that the current is injected into the ridge portion in a narrowed state.

In general, a p-n junction formed between an n-type current blocking layer and a p-type cladding layer has large electric capacitance, and hence serves as a factor inhibiting high-speed operation of a semiconductor laser device. The electric capacitance of the p-n junction is increased as the carrier concentration in this p-n junction is increased.

Therefore, the semiconductor laser device 120 shown in FIG. 34 is provided with the current blocking layer 125 having a low carrier concentration, in order to reduce the electric capacitance in the p-n junction between the n-type current blocking layer 126 and the p-type cladding layer 124.

This current blocking layer 125 has a lower carrier concentration than the n-type current blocking layer 126. Therefore, the current blocking layer 125 having a low carrier concentration defines a depletion region in the p-n junction between the n-type current blocking layer 126 and the p-type cladding layer 124, for reducing the electric capacitance. Thus, the semiconductor laser device 120 is enabled to operate at a high frequency.

In the semiconductor laser device 120 having the current blocking layer 125 of a low carrier concentration having a narrower band gap than the p-type cladding layer 124, however, valence bands of the p-type cladding layer 124 and the current blocking layer 125 of a low carrier concentration have energy band structures shown in FIG. 35.

FIG. 35 is a model diagram showing the energy band structures of the valence bands of the p-type cladding layer 124 and the current blocking layer 125 having a low carrier concentration. As shown in FIG. 35, the band gap of the current blocking layer 125 having a low carrier concentration is sufficiently smaller than the band gap of the p-type cladding layer 124, and hence carriers are readily injected from the p-type cladding layer 124 into the current blocking layer 125 having a low carrier concentration and stored therein. Consequently, since depletion of the p-n junction between the n-type current blocking layer 126 and the p-type cladding layer 124 is inhibited, electric capacitance between the current blocking layer 125 having a low carrier concentration and the p-type cladding layer 124 is increased. Therefore, the operating speed of the semiconductor laser device 120 cannot be sufficiently increased.

SUMMARY OF THE INVENTION

An object of the present invention is to provide a semiconductor laser device sufficiently increased in operating speed.

A semiconductor laser device according to an aspect of the present invention comprises an active layer, a first cladding layer of a first conduction type provided on the active layer, a current blocking layer of a second conduction type provided on the first cladding layer except a current injection region, a low carrier concentration layer provided on the side of the current blocking layer between the first cladding layer and the current blocking layer and having a lower carrier concentration than the current blocking layer and a depletion enhancement layer provided on the side of the first cladding layer between the first cladding layer and the current blocking layer for inhibiting storage of carriers in the low carrier concentration layer.

In the semiconductor laser device, the depletion enhancement layer inhibits storage of carriers from the first cladding layer into the low carrier concentration layer. Thus, the low carrier concentration layer is kept in a depleted state. Therefore, electric capacitance between the current blocking layer and the first cladding layer is kept small for sufficiently increasing the operating speed of the semiconductor laser device.

The band gaps of the first cladding layer, the depletion enhancement layer and the low carrier concentration layer may be reduced in this order.

Thus, the depletion enhancement layer having an intermediate band gap is provided between the first cladding layer having a large band gap and the low carrier concentration layer having a small band gap.

In this case, the band offset between the first cladding layer and the depletion enhancement layer is smaller than the band offset between the first cladding layer and the low carrier concentration layer, whereby carriers are hardly injected from the first cladding layer into the depletion enhancement layer while carriers are more hardly injected into the low carrier concentration layer. Further, the carriers are injected from the first cladding layer into both of the low carrier concentration layer and the depletion enhancement layer in a divided manner, whereby the quantity of carriers stored in the low carrier concentration layer is reduced. Thus, storage of carriers in the low carrier concentration layer can be inhibited by the simple structure of setting the band gap of the depletion enhancement layer to the intermediate level between the low carrier concentration layer and the first cladding layer.

The first cladding layer may have a flat portion formed on the active layer and a ridge portion formed on the flat portion in the current injection region, the depletion enhancement layer may be formed on the flat portion located on both sides of the ridge portion and on the side surfaces of the ridge portion, and the low carrier concentration layer and the current blocking layer may be successively formed on the depletion enhancement layer.

In this case, the depletion enhancement layer inhibits storage of carriers from the flat portion of the first cladding layer into the low carrier concentration layer. Thus, the low carrier concentration layer is kept in the depleted state, and the electric capacitance between the flat portion of the first cladding layer and the current blocking layer is kept small.

The thickness of the depletion enhancement layer is preferably at least 10 nm. Thus, the semiconductor laser device is more improved in high-frequency characteristic.

The thickness of the depletion enhancement layer is preferably at least 15 nm. Thus, the semiconductor laser device is further improved in high-frequency characteristic.

The semiconductor laser device may further comprise a ridge-shaped second cladding layer of a first conduction type provided on the depletion enhancement layer in the current injection region, the depletion enhancement layer may be formed on the first cladding layer, and the lower carrier concentration layer and the current blocking layer may be successively formed on the depletion enhancement layer located on both sides of the second cladding layer and on the side surfaces of the second cladding layer.

In this case, the depletion enhancement layer inhibits storage of carriers from the first cladding layer into the low carrier concentration layer. Thus, the low carrier concentration layer is kept in the depleted state and the electric capacitance between the first cladding layer and the current blocking layer is kept small.

The thickness of the depletion enhancement layer is preferably at least 15 nm. Thus, the semiconductor laser device is more improved in high-frequency characteristic.

The thickness of the depletion enhancement layer is preferably at least 20 nm. Thus, the semiconductor laser device is further improved in high-frequency characteristic.

The depletion enhancement layer, the low carrier concentration layer and the current blocking layer may be successively formed on the first cladding layer except the current injection region, and the semiconductor laser device may further comprise a second cladding layer of a first conduction type provided to fill up a space enclosed with the side surfaces of the depletion enhancement layer, the low carrier concentration layer and the current blocking layer and the upper surface of the first cladding layer in the current injection region.

In this case, the depletion enhancement layer inhibits storage of carriers from the first cladding layer into the low carrier concentration layer. Thus, the low carrier concentration layer is kept in the depleted state and the electric capacitance between the first cladding layer and the current blocking layer is kept small.

The thickness of the depletion enhancement layer is preferably at least 15 nm. Thus, the semiconductor laser device is more improved in high-frequency characteristic.

The thickness of the depletion enhancement layer is preferably at least 20 nm. Thus, the semiconductor laser device is further improved in high-frequency characteristic.

The depletion enhancement layer may have a single-layer structure or a superlattice structure.

The active layer may include a layer made of $(Al_{x1}Ga_{1-x1})_{y1}In_{1-y1}P$, the depletion enhancement layer may be made of $(Al_{x2}Ga_{1-x2})_{y2}In_{1-y2}P$ or $Al_{x2}Ga_{1-x2}As$, the low carrier concentration layer may be made of $(Al_{x3}Ga_{1-x3})_{y3}In_{1-y3}P$ or $Al_{x3}Ga_{1-x3}As$, the current blocking layer may be made of $(Al_{x4}Ga_{1-x4})_{y4}In_{1-y4}P$ or $Al_{x4}Ga_{1-x4}As$, and x1, x2, x3, x4, y1, y2, y3 and y4 may be at least zero and not more than 1 respectively.

The active layer may include a layer made of $Al_{x1}Ga_{1-x1}As$, the depletion enhancement layer may be made of $Al_{x2}Ga_{1-x2}As$, the low carrier concentration layer may be made of $Al_{x3}Ga_{1-x3}As$, the current blocking layer may be made of $Al_{x4}Ga_{1-x4}As$, and x1, x2, x3 and x4 may be at least zero and not more than 1 respectively.

The active layer may be made of $In_{x1}Ga_{1-x1}N$, the depletion enhancement layer may be made of $Al_{x2}Ga_{1-x2}N$, the low carrier concentration layer may be made of $Al_{x3}Ga_{1-x3}N$, the current blocking layer may be made of $Al_{x4}Ga_{1-x4}N$, and x1, x2, x3 and x4 may be at least zero and not more than 1 respectively.

The active layer preferably includes a layer made of $(Al_{x1}Ga_{1-x1})_{y1}In_{1-y1}P$, the depletion enhancement layer is preferably made of $(Al_{x2}Ga_{1-x2})_{y2}In_{1-y2}P$, the low carrier concentration layer is preferably made of $Al_{x3}Ga_{1-x3}As$, the current blocking layer is preferably made of $Al_{x4}Ga_{1-x4}As$, x1, x2, x3, x4, y1 and y2 are preferably at least zero and not more than 1 respectively, and the first conduction type is preferably the p type, and the second conduction type is preferably the n type.

In this case, improvement of the high-frequency characteristic resulting from the depletion enhancement layer inhibiting storage of carriers from the first cladding layer into the low carrier concentration layer is particularly remarkable.

A semiconductor laser device according to another aspect of the present invention comprises an active layer, a first cladding layer of a first conduction type provided on the active layer, a first current blocking layer having a low carrier concentration provided on the first cladding layer except a current injection region and a depletion enhancement layer formed between the first cladding layer and the first current blocking layer for inhibiting storage of carriers in the first current blocking layer, while the depletion enhancement layer has an energy level in band gap supplying second conduction type carriers to compensate for first conduction type carriers supplied from the first cladding layer due to a modulation doping effect.

The first current blocking layer having a low carrier concentration is an undoped layer or a layer doped with a low density of impurity In a range capable of blocking a current.

In the semiconductor laser device, the depletion enhancement layer formed with the energy level in band gap supplying the second conduction type carriers is formed between the first cladding layer and the first current blocking layer.

In this case, the second conduction type carriers supplied from the energy level in band gap of the depletion enhancement layer compensate for the first conduction type carriers supplied from the first cladding layer. Therefore, storage of carriers can be prevented in the first current blocking layer having a low carrier concentration. Thus, the first current blocking layer is kept in a depleted state. Therefore, electric capacitance generated between the first current blocking layer and the first cladding layer can be reduced and the operating speed of the semiconductor laser device can be sufficiently increased.

At this point, the first current blocking layer has a narrower band gap than the first cladding layer. When the first current blocking layer has a narrower band gap than the first cladding layer, carriers are readily injected from the first cladding layer into the first current blocking layer and stored therein. In this case, however, the depletion enhancement layer formed between the first cladding layer and the first current blocking layer can inhibit storage of carriers in the first current blocking layer.

The energy level in band gap preferably has such density that substantially all energy level in band gap ionize under a condition applying no bias voltage voltage. In this case, it is possible to effectively compensate for the first conduction type carriers supplied from the first cladding layer. Therefore, storage of carriers in the first current blocking layer having a low carrier concentration can be more effectively inhibited.

The energy level in band gap may be formed by doping with a second conduction type impurity. In this case, the depletion enhancement layer provided with the energy level in band gap can be readily formed.

The material of the depletion enhancement layer may be the same as the material of the first current blocking layer. In this case, the band gap width of the depletion enhancement layer and the first current blocking layer are equalized with each other.

The first cladding layer may have a larger band gap than the depletion enhancement layer, and the semiconductor laser device may further comprise an intermediate band gap layer provided between the first cladding layer and the depletion enhancement layer and having a band gap smaller than the band gap of the first cladding layer and larger than the band gap of the depletion enhancement layer.

In this case, carriers are hardly injected from the first cladding layer into the depletion enhancement layer and hardly injected into the first current blocking layer having a low carrier concentration either due to the intermediate band gap layer provided between the first cladding layer and the depletion enhancement layer. In this case, further, the carriers are injected into both of the depletion enhancement layer and the intermediate band gap layer in a divided manner, and hence hardly injected into the first current blocking layer.

Thus, storage of carriers in the first current blocking layer is further inhibited.

Further, the ranges of the thickness and the carrier concentration of the depletion enhancement layer capable increasing the operating speed of the semiconductor layer device are widened by providing the intermediate band gap layer in the aforementioned manner. Therefore, the thickness and the carrier concentration of the depletion enhancement layer can be readily set so that the depletion enhancement layer can be readily prepared.

The depletion enhancement layer may have a band gap smaller than the band gap of the first cladding layer and larger than the band gap of the first current blocking layer. In this case, the depletion enhancement layer serves as the aforementioned intermediate band gap layer, thereby further inhibiting storage of carriers in the first current blocking layer.

Also in this case, the ranges of the thickness and the carrier concentration of the depletion enhancement layer capable of increasing the operating speed of the semiconductor laser device are widened. Thus, the thickness and the carrier concentration of the depletion enhancement layer can be readily set so that the depletion enhancement layer can be readily prepared.

The first cladding layer may have a flat portion formed on the active layer and a ridge portion formed on the flat portion in the current injection region, the depletion enhancement layer may be formed on the flat portion located on both sides of the ridge portion and on the side surfaces of the ridge portion, and the first current blocking layer may be formed on the depletion enhancement layer. In this case, a ridge guided semiconductor laser device improved in operating speed is implemented.

The depletion enhancement layer and the first current blocking layer may be successively formed on the first cladding layer except the current injection region, and the semiconductor laser device may further comprise a second cladding layer of a first conduction type provided to fill up a space enclosed with the side surfaces of the depletion enhancement layer and the first current blocking layer and the upper surface of the first cladding layer in the current injection region. In this case, a self-aligned semiconductor laser device improved in operating speed is implemented.

The depletion enhancement layer may be formed on a region excluding the current injection region. In this case, a current is quickly injected into the current injection region provided with no depletion enhancement layer of the opposite conduction type.

The semiconductor laser device may further comprise a second current blocking layer of a second conduction type provided on the first current blocking layer.

A semiconductor laser device according to another aspect of the present invention comprises an active layer, a first cladding layer of a first conduction type provided on the active layer, a first current blocking layer having a low carrier concentration provided on the first cladding layer except a current injection region and a depletion enhancement layer formed between the first cladding layer and the first current blocking layer for inhibiting storage of carriers in the first current blocking layer.

In the semiconductor laser device, the depletion enhancement layer inhibits storage of carriers from the first cladding layer into the first current blocking layer having a low carrier concentration. Thus, the first current blocking layer having a low carrier concentration is kept in a depleted state. Therefore, electric capacitance between the first current blocking layer having a low carrier concentration and the first cladding layer is kept small for sufficiently increasing the operating speed of the semiconductor laser device.

At this point, the first current blocking layer having a low concentration has a narrower band gap than the first cladding layer. When the first current blocking layer having a low carrier concentration has a narrower band gap than the first cladding layer, carriers are readily injected from the first cladding layer into the first current blocking layer having a low carrier concentration and stored therein. In this case, however, the depletion enhancement layer formed between the first cladding layer and the first current blocking layer having a low carrier concentration can inhibit storage of carriers in the first current blocking layer having a low carrier concentration.

The band gaps of the first cladding layer, the depletion enhancement layer and the first current blocking layer having a low carrier concentration may be reduced in this order.

Thus, the depletion enhancement layer having an intermediate band gap is provided between the first cladding layer having a large band gap and the first current blocking layer having a low carrier concentration having a small band gap.

In this case, the band offset between the first cladding layer and the depletion enhancement layer is smaller than the band offset between the first cladding layer and the first current blocking layer having a low carrier concentration, whereby carriers are hardly injected from the first cladding layer into the depletion enhancement layer while carriers are more hardly injected into the first current blocking layer having a low carrier concentration. Further, the carriers are injected from the first cladding layer into both of the first current blocking layer having a low carrier concentration and the depletion enhancement layer in a divided manner, whereby the quantity of carriers stored in the low carrier concentration layer is reduced. Thus, storage of carriers in the first current blocking layer having a low carrier concentration can be inhibited by the simple structure of setting the band gap of the depletion enhancement layer to the intermediate level between the first current blocking layer having a low carrier concentration and the first cladding layer.

The first cladding layer may have a flat portion formed on the active layer and a ridge portion formed on the flat portion in the current injection region, the depletion enhancement layer may be formed on the flat portion located on both sides of the ridge portion and on the side surfaces of the ridge portion, and the first current blocking layer having a low carrier concentration may be formed on the depletion enhancement layer.

In this case, the depletion enhancement layer inhibits storage of carriers from the flat portion of the first cladding layer into the first current blocking layer having a low carrier concentration. Thus, the first current blocking layer having a low carrier concentration is kept in the depleted state, and the electric capacitance between the flat portion of the first cladding layer and the first current blocking layer having a low carrier concentration is kept small.

The semiconductor laser device may further comprise a ridge-shaped second cladding layer of a first conduction type provided on the depletion enhancement layer in the current injection region, the depletion enhancement layer may be formed on the first cladding layer, and the first current blocking layer having a lower carrier concentration may be formed on the depletion enhancement layer located on both sides of the second cladding layer and on the side surfaces of the second cladding layer.

In this case, the depletion enhancement layer inhibits storage of carriers from the first cladding layer into the first current blocking layer having a low carrier concentration layer. Thus, the first current blocking layer having a low carrier concentration is kept in the depleted state and the electric capacitance between the first cladding layer and the first current blocking layer having a low carrier concentration is kept small.

The depletion enhancement layer and the first current blocking layer having a low carrier concentration may be successively formed on the first cladding layer except the current injection region, and the semiconductor laser device may further comprise a second cladding layer of a first conduction type provided to fill up a space enclosed with the side surfaces of the depletion enhancement layer and the first current blocking layer having a low carrier concentration layer and the upper surface of the first cladding layer in the current injection region.

In this case, the depletion enhancement layer inhibits storage of carriers from the first cladding layer into the first current blocking layer having a low carrier concentration. Thus, the first current blocking layer having a low carrier concentration is kept in the depleted state and the electric capacitance between the first cladding layer and the first current blocking layer having a low concentration is kept small.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 18 and 19 are typical sectional views showing steps of a method of fabricating the semiconductor laser device shown in FIG. 17;

DESCRIPTION OF THE PREFERRED EMBODIMENTS (1) First Embodiment

Figure 1:
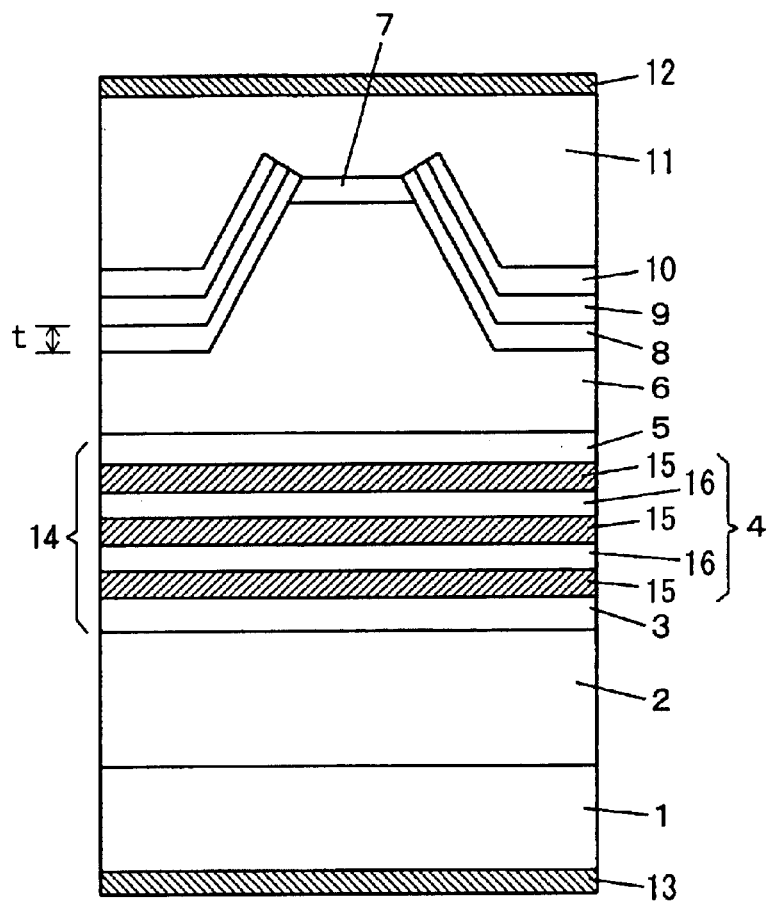
FIG. 1 is a typical sectional view of a semiconductor laser device according to a first embodiment of the present invention.

FIG. 1 is a typical sectional view of a semiconductor laser device according to a first embodiment of the present invention.

In the semiconductor laser device shown in FIG. 1, a cladding layer 2 of n-$(Al_{0.7}Ga_{0.3})_{0.5}In_{0.5}P$ having a thickness of 1500 nm and an emission layer 14 described later are successively formed on an n-GaAs substrate 1. A cladding layer 2 of p-$(Al_{0.7}Ga_{0.3})_{0.5}In_{0.5}P$ having a thickness of 1500 nm and a contact layer of p-$Ga_{0.5}In_{0.5}P$ having a thickness of 200 nm are successively formed on the emission layer 14. The p-type cladding layer 6 and the p-type contact layer 7 are etched to define a ridge portion.

The carrier concentration of the n-GaAs substrate 1 is $1\times10^{18}$ cm$^{-3}$, the carrier concentration of the n-type cladding layer 2 is $3\times10^{17}$ cm$^{-3}$, and the carrier concentration of the p-type contact layer 7 is $2\times10^{18}$ cm$^{-3}$ respectively.

Further, a depletion enhancement layer 8 of a thickness t having a striped opening on the upper surface of the ridge portion is formed on the p-type cladding layer 6. A low carrier concentration layer 9 of GaAs of 1000 nm in thickness having a striped opening on the upper surface of the ridge portion is formed on the depletion enhancement layer 8. An n-type current blocking layer 10 of n-GaAs of 500 nm in thickness having a striped opening on the upper surface of the ridge portion is formed on the low carrier concentration layer 9. The carrier concentration of the n-type current blocking layer 10 is $8\times10^{17}$ cm$^{-3}$. The carrier concentration of the low carrier concentration layer 9 is lower than that of the n-type current blocking layer 10.

A contact layer 11 of p-GaAs having a thickness of 3000 nm is formed on the p-type contact layer 7 located in the striped opening of the n-type current blocking layer 10 and on the n-type current blocking layer 10. The carrier concentration of the p-type contact layer is $3\times10^{19}$ cm$^{-3}$. A p-electrode 12 having a thickness of 300 nm is formed on the p-type contact layer 11. An n electrode 13 having a thickness of 300 nm is formed on the back side of the n-GaAs substrate 1.

The emission layer 14 includes a guide layer 3 of $(Al_{0.5}Ga_{0.5})_{0.5}In_{0.5}P$ having a thickness of 30 nm formed on the n-type cladding layer 2, a quantum well active layer 4 formed on the guide layer 3 and a guide layer 5 of $(Al_{0.5}Ga_{0.5})_{0.5}In_{0.5}P$ having a thickness of 30 nm formed on the quantum well active layer 4.

The quantum well active layer 4 has a superlattice structure formed by alternately stacking a plurality of quantum well layers 15 of $Ga_{0.5}In_{0.5}P$ each having a thickness of 5 nm and a plurality of barrier layers 16 of $(Al_{0.5}Ga_{0.5})_{0.5}In_{0.5}P$ each having a thickness of 5 nm. For example, the number of the barrier layers 16 is 2, and the number of the quantum well layers 15 is 3.

Table 1 shows the aforementioned structure.

TABLE 1

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | Quantum Well Active Layer | Guide Layer of $(Al_{0.5}Ga_{0.5})_{0.5}In_{0.5}P$ | 30 | | 3 |
| | | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 1500 | $3 \times 10^{17}$ | 6 |
| | | Contact Layer of p-$(Ga_{0.5}In_{0.5}P)$ | 200 | $2 \times 10^{18}$ | 7 |
| | | Depletion Enhancement Layer of $Ga_{0.5}In_{0.5}P$ | t | | 8 |
| | | Low Carrier Concentration Layer of GaAs | 1000 | | 9 |
| | | Current Blocking Layer of n-GaAs | 500 | $8 \times 10^{17}$ | 10 |
| | | Contact Layer of p-GaAs | 3000 | $3 \times 10^{19}$ | 11 |
| | | p-Electrode | 300 | | 12 |
| | | n-Electrode | 300 | | 13 |

Figure 2:
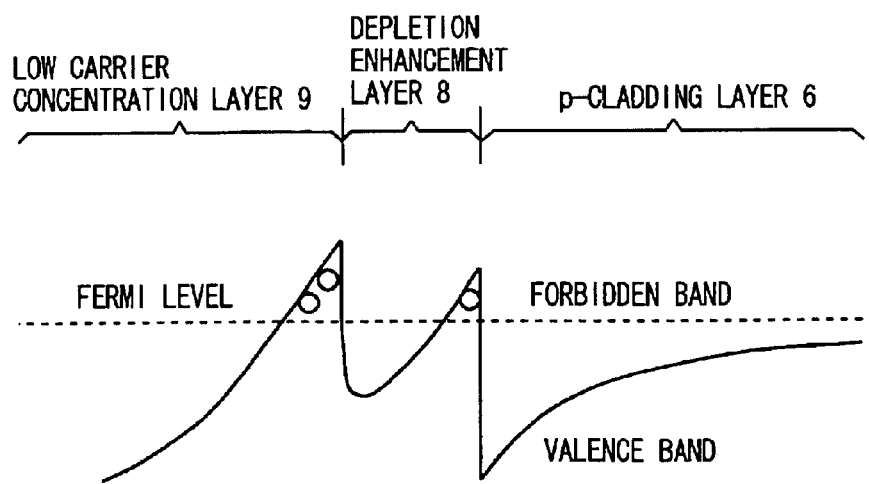
FIG. 2 is an energy band diagram of valence bands of a p-type cladding layer, a depletion enhancement layer and a low carrier concentration layer in the semiconductor laser device shown in FIG. 1.

FIG. 2 typically shows an energy band diagram of valence bands of the p-type cladding layer 6, the depletion enhancement layer 8 and the low carrier concentration layer 9 of the semiconductor laser device shown in FIG. 1.

As shown in FIG. 2, the band gaps of the p-type cladding layer 6, the depletion enhancement layer 8 and the low carrier concentration layer 9 are reduced in this order. Therefore, the band offset between the p-type cladding layer 6 and the depletion enhancement layer 8 in contact therewith is reduced as compared with the band offset between the p-type cladding layer 6 and the low carrier concentration layer 9 so that carriers are hardly injected from the p-type cladding layer 6 into the depletion enhancement layer 8 and hardly injected into the low carrier concentration layer 9 either. Consequently, the quantity of carriers stored in the low carrier concentration layer 9 is reduced. Further, carriers are injected into both of the low carrier concentration layer 9 and the depletion enhancement layer 8 in a divided manner, whereby the quantity of the carriers stored in the low carrier concentration layer 9 is reduced.

The low carrier concentration layer 9, storing a small quantity of carriers, is kept in a depleted state, whereby the electric capacitance between the n-type current blocking layer 10 and the p-type cladding layer 6 is kept small for sufficiently increasing the operating speed of the semiconductor laser device.

Thus, the high-frequency characteristic of the semiconductor laser device shown in FIG. 1 is improved through the simple structure of setting the band gap of the depletion enhancement layer 8 to the intermediate level between those of the low carrier concentration layer 9 and the p-type cladding layer 6.

Figure 3:
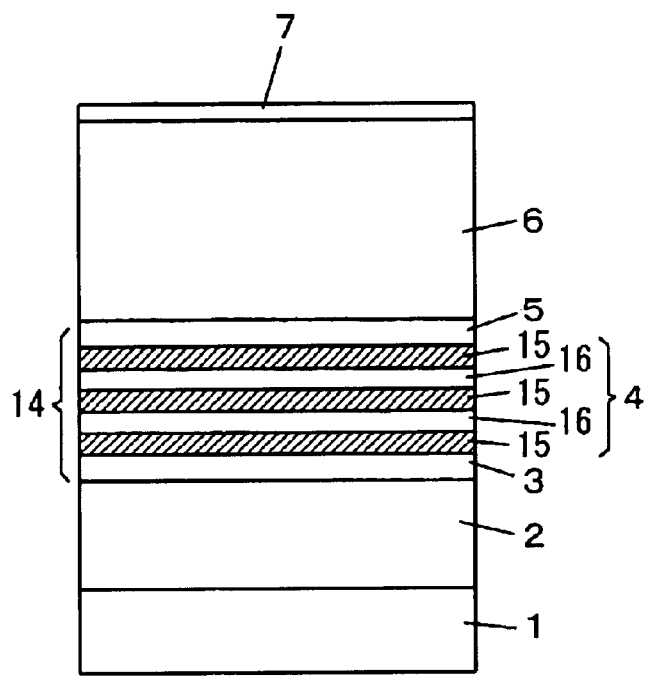
FIGS. 3 to 5 are typical sectional views showing steps in a method of fabricating the semiconductor laser device shown in FIG. 1.
Figure 4:
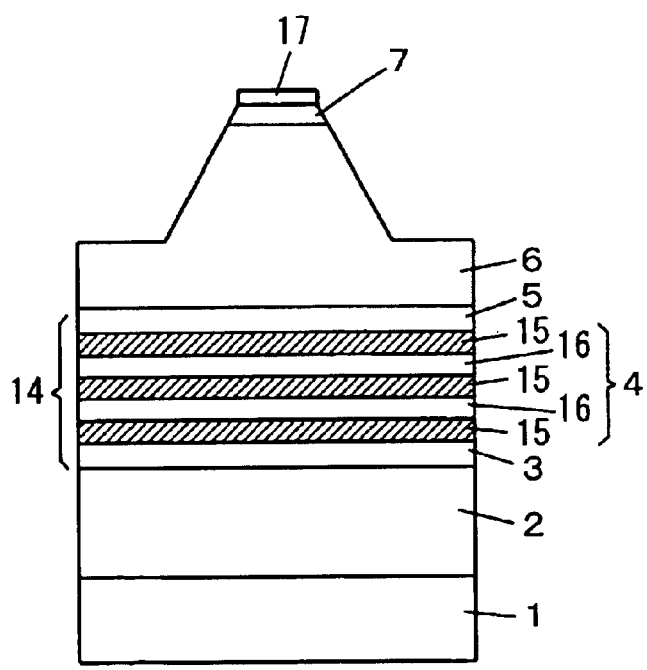
Figure 5:
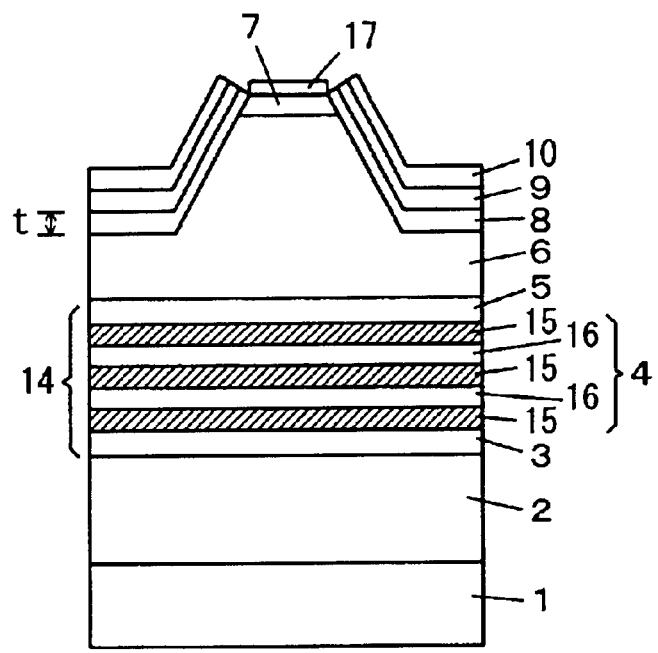

FIGS. 3, 4 and 5 are typical sectional views showing steps in a method of fabricating the semiconductor laser device shown in FIG. 1.

As shown in FIG. 3, the cladding layer 2 of n-$(Al_{0.7}Ga_{0.3})_{0.5}In_{0.5}P$, the guide layer 3 of $(Al_{0.5}Ga_{0.5})_{0.5}In_{0.5}P$, the quantum well active layer 4, the guide layer 5 of $(Al_{0.5}Ga_{0.5})_{0.5}In_{0.5}P$, the cladding layer 6 of $(Al_{0.7}Ga_{0.3})_{0.5}In_{0.5}P$ and the contact layer 7 of p-$Ga_{0.5}In_{0.5}P$ are successively grown on the n-GaAs substrate 1 by MOCVD (metal-organic chemical vapor deposition).

As shown in FIG. 4, an $SiO_2$ film is formed on the p-type contact layer 7 and patterned for forming a striped $SiO_2$ film 17. Thereafter the p-type contact layer 7 and the p-type cladding layer 6 are partially removed by etching through the $SiO_2$ film 17 serving as a mask, for forming the ridge portion.

As shown in FIG. 5, the depletion enhancement layer 8 of $Ga_{0.5}In_{0.5}P$, the low carrier concentration layer 9 of GaAs and the current blocking layer 10 of n-GaAs are successively grown on the p-type cladding layer 6 by MOCVD through the $SiO_2$ film 17 serving as a selective growth mask.

The $SiO_2$ film 17 is removed and thereafter the contact layer 11 of p-GaAs is formed on the n-type current blocking layer 10 and on the p-type contact layer 7 by MOCVD as shown in FIG. 1, while the p-electrode 12 of Cr/Au is formed on the surface of the p-type contact layer 11 and the n electrode 13 of AuGe/Ni/Au is formed on the back side of the n-GaAs substrate 1.

Figure 6:
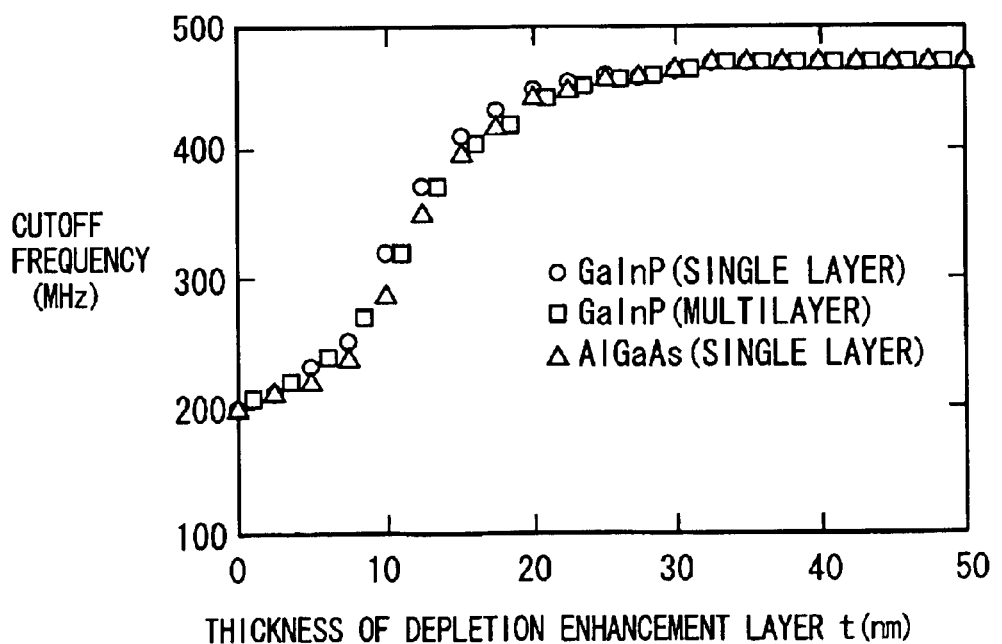
FIG. 6 is a diagram showing results of measurement of the relation between a cutoff frequency and the thickness of the depletion enhancement layer in the semiconductor laser device shown in FIG. 1.

FIG. 6 is a diagram showing the results of measurement of a cutoff frequency of the semiconductor laser device shown in Table 1 with variation of the thickness t of the depletion enhancement layer 8. The cutoff frequency is such a frequency that the amplitude of a laser beam superposed with a sine wave output from the object semiconductor laser device is reduced by 3 dB as compared with the case of superposing a low frequency (the superposed frequency is not more than 10 MHz in this example). Referring to FIG. 6, ○ denotes a case of employing a depletion enhancement layer 8 of $Ga_{0.5}In_{0.5}P$ having a single-layer structure, □ denotes a case of employing a depletion enhancement layer 8 of a superlattice structure alternately having $(Al_{0.7}Ga_{0.3})_{0.5}In_{0.5}P$ barrier layers and $Ga_{0.5}In_{0.5}P$ well layers (the thickness t is the sum of the thicknesses of the well layers), and Δ denotes a case of employing a depletion enhancement layer 8 of $Al_{0.45}Ga_{0.55}As$ having a single-layer structure respectively.

The cutoff frequency, 200 MHz when the semiconductor laser device is formed with no depletion enhancement layer 8, is improved when the thickness t of the depletion enhancement layer 8 is increased, remarkably improved when the thickness t of the depletion enhancement layer 8 exceeds 10 nm, and substantially saturated when the thickness t is about 20 nm. Therefore, the thickness t of the depletion enhancement layer 8 is preferably at least 10 nm, and more preferably at least 20 nm saturating improvement of the cutoff frequency. When the thickness t of the depletion enhancement layer 8 is at least 15 nm, the intermediate level between 10 nm and 20 nm, the high-frequency characteristic can be sufficiently improved.

Figure 7:
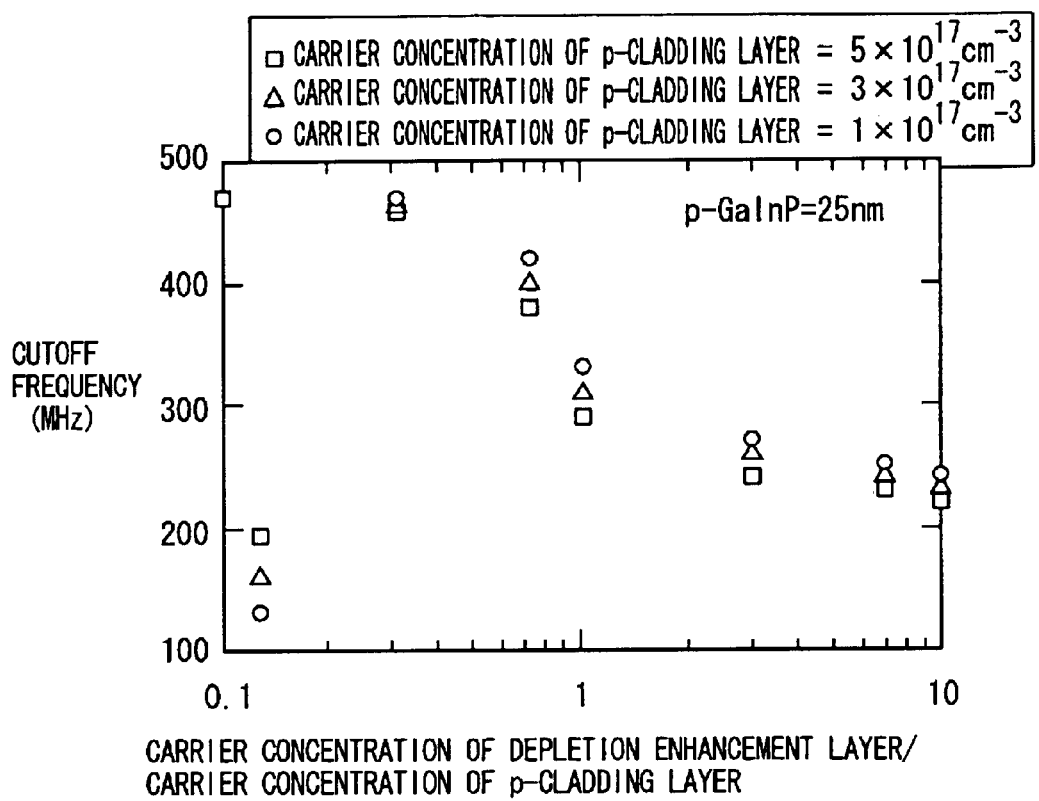
FIG. 7 illustrates an effect of improving the cutoff frequency by doping the depletion enhancement layer of the semiconductor laser device according to the first embodiment.

FIG. 7 illustrates an effect of improving the cutoff frequency by doping the depletion enhancement layer 8 of the semiconductor laser device shown in FIG. 1. The horizontal axis shows the ratio of the carrier concentration of the depletion enhancement layer 8 to the carrier concentration of the p-type cladding layer 6, and the vertical axis shows the cutoff frequency. The depletion enhancement layer 8 of this semiconductor laser device is made of p-type GaInP, and the thickness t thereof is 25 nm.

As shown in FIG. 7, the effect of improving the cutoff frequency is small when the carrier concentration of the depletion enhancement layer 8 is higher than that of the p-type cladding layer 6, while a large effect of improving the cutoff frequency is attained when the carrier concentration of the depletion enhancement layer 8 is lower than that of the p-type cladding layer 6. Therefore, the carrier concentration of the depletion enhancement layer 8 is preferably lower than that of the p-type cladding layer 6.

(2) Second Embodiment

A semiconductor laser device according to a second embodiment of the present invention is now described.

The structure of the semiconductor laser device according to the second embodiment is similar to that shown in FIG. 1, while the materials, thicknesses and carrier concentrations of respective layers are different from those in the first embodiment. Table 2 shows the materials, thicknesses and carrier concentrations of the respective layers forming the semiconductor laser device according to this embodiment.

TABLE 2

| Name of Layer | | Composition and Name of Layer | Thickness (nm) | Carrier Concentration ($cm^{-3}$) | Numeral |
|---|---|---|---|---|---|
| | | n-GaAs Substrate | | $1 \times 10^{18}$ | 1 |
| | | Cladding Layer of n-$Al_{0.45}Ga_{0.55}As$ | 1500 | $3 \times 10^{17}$ | 2 |
| Emission Layer | | Guide Layer of $Al_{0.35}Ga_{0.65}As$ | 30 | | 3 |
| | Quantum Well Active Layer | Quantum Well Layer of $Al_{0.1}Ga_{0.9}As$ | 5 | | 15 |
| | | Barrier Layer of $Al_{0.35}Ga_{0.65}As$ | 5 | | 16 |
| | | Guide Layer of $Al_{0.35}Ga_{0.65}As$ | 30 | | 5 |
| | | Cladding Layer of p-$Al_{0.45}Ga_{0.55}As$ | 1500 | $1 \times 10^{18}$ | 6 |

TABLE 2-continued

| Name of Layer | Composition and Name of Layer | Thickness (nm) | Carrier Concentration (cm$^{-3}$) | Numeral |
|---|---|---|---|---|
| | Contact Layer of p-GaAs | 200 | 4 × 10$^{18}$ | 7 |
| | Depletion Enhancement Layer of Al$_{0.25}$Ga$_{0.75}$As | t | | 8 |
| | Low Carrier Concentration Layer of GaAs | 1000 | | 9 |
| | Current Blocking Layer of n-GaAs | 500 | 5 × 10$^{17}$ | 10 |
| | Contact Layer of n-GaAs | 3000 | 3 × 10$^{19}$ | 11 |
| | p-Electrode | 300 | | 12 |
| | n-Electrode | 300 | | 13 |

Figure 8:
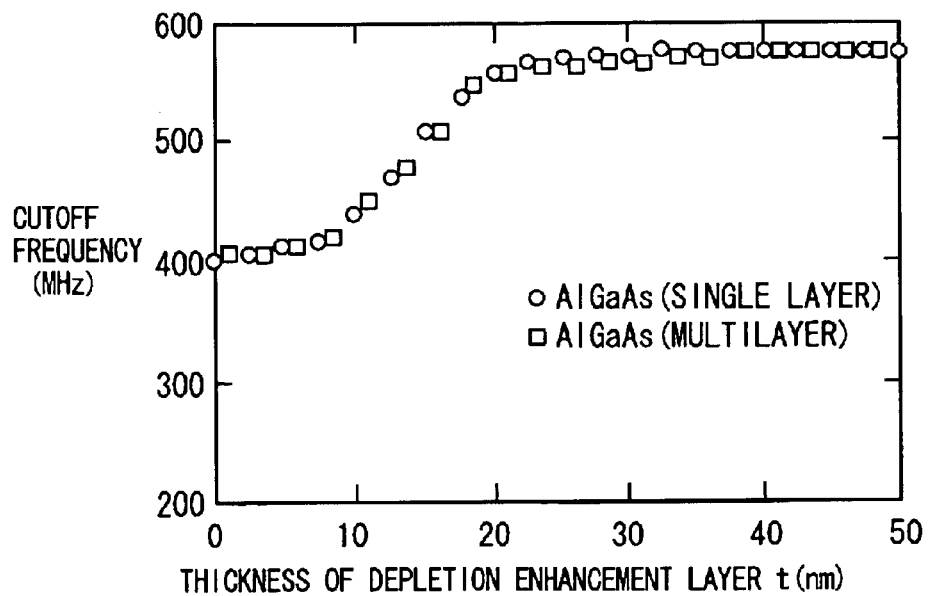
FIG. 8 is a diagram showing results of measurement of the relation between a cutoff frequency and the thickness of a depletion enhancement layer in a semiconductor laser device according to a second embodiment of the present invention.

FIG. 8 illustrates results of measurement of a cutoff frequency of the semiconductor laser device shown in Table 2 with variation of the thickness t of a depletion enhancement layer 8. Referring to FIG. 8, ○ denotes a case of employing a depletion enhancement layer 8 of Al$_{0.25}$Ga$_{0.75}$As having a single-layer structure, and □ denotes a case of employing a depletion enhancement layer 8 of a superlattice structure alternately having Al$_{0.45}$Ga$_{0.55}$As barrier layers and Al$_{0.25}$Ga$_{0.75}$As well layers (the thickness t is the sum of the thicknesses of the well layers).

The cutoff frequency, 400 MHz when the semiconductor laser device is formed with no depletion enhancement layer 8, is improved when the thickness t of the depletion enhancement layer 8 is increased, remarkably improved when the thickness t of the depletion enhancement layer 8 exceeds 10 nm, and substantially saturated when the thickness t is about 20 nm. Therefore, the thickness t of the depletion enhancement layer 8 is preferably at least 10 nm, and more preferably at least 20 nm saturating improvement of the cutoff frequency. When the thickness t of the depletion enhancement layer 8 is at least 15 nm, the intermediate level between 10 nm and 20 nm, the high-frequency characteristic can be sufficiently improved.

(3) Third Embodiment

A semiconductor laser device according to a third embodiment of the present invention is now described.

The structure of the semiconductor laser device according to the third embodiment is similar to that shown in FIG. 1, while the materials, thicknesses and carrier concentrations of respective layers are different from those in the first embodiment. Table 3 shows the materials, thicknesses and carrier concentrations of the respective layers forming the semiconductor laser device according to this embodiment.

TABLE 3

| Name of Layer | Composition and Name of Layer | Thickness (nm) | Carrier Concentration (cm$^{-3}$) | Numeral |
|---|---|---|---|---|
| | n-GaN Substrate | | 1 × 10$^{18}$ | 1 |
| | Cladding Layer of n-Al$_{0.15}$Ga$_{0.85}$N | 1000 | 3 × 10$^{17}$ | 2 |
| Emission Layer | Guide Layer of GaN | 30 | | 3 |
| Quantum Well Active | Quantum Well Layer of In$_{0.15}$Ga$_{0.85}$N | 5 | | 15 |

TABLE 3-continued

| Name of Layer | Composition and Name of Layer | Thickness (nm) | Carrier Concentration (cm$^{-3}$) | Numeral |
|---|---|---|---|---|
| Layer | Barrier Layer of In$_{0.05}$Ga$_{0.95}$N | 5 | | 16 |
| | Guide Layer of GaN | 30 | | 5 |
| | Cladding Layer of p-Al$_{0.15}$Ga$_{0.85}$N | 1000 | 2 × 10$^{17}$ | 6 |
| | Contact Layer of p-GaN | 200 | 3 × 10$^{17}$ | 7 |
| | Depletion Enhancement Layer of Al$_{0.07}$Ga$_{0.93}$N | t | | 8 |
| | Low Carrier Concentration Layer of n-GaN | 800 | | 9 |
| | Current Blocking Layer of n-GaN | 200 | 5 × 10$^{17}$ | 10 |
| | Contact Layer of p-GaN | 3000 | 8 × 10$^{17}$ | 11 |
| | p-Electrode | 300 | | 12 |
| | n-Electrode | 300 | | 13 |

Figure 9:
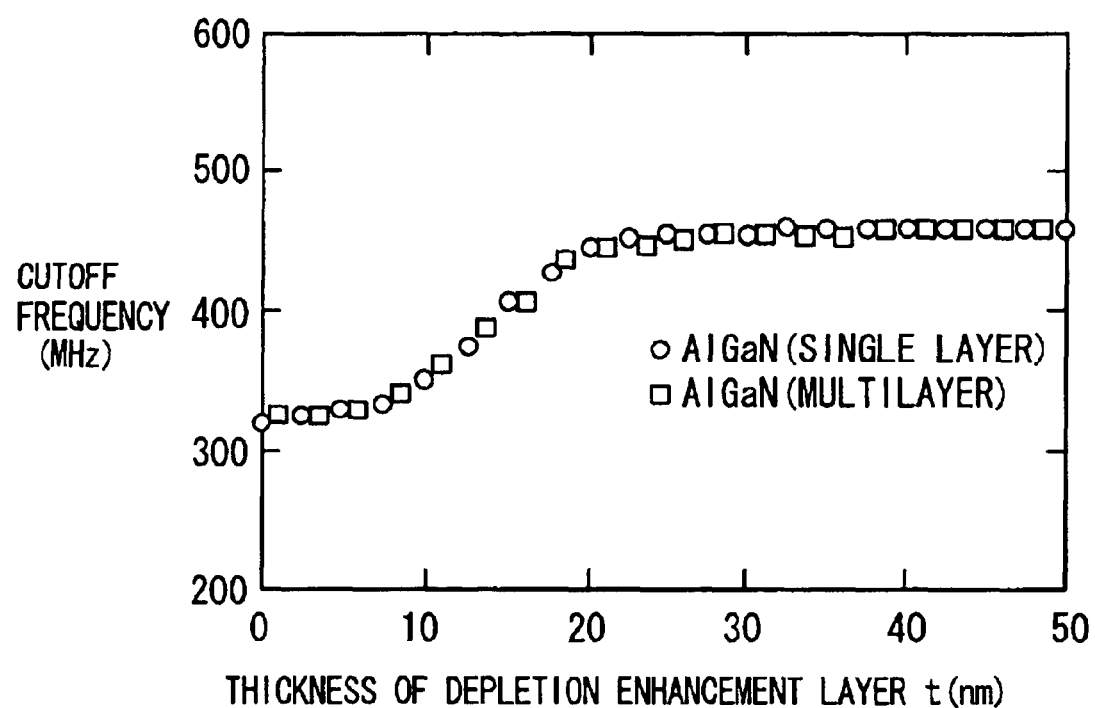
FIG. 9 is a diagram showing results of measurement of the relation between a cutoff frequency and the thickness of a depletion enhancement layer in a semiconductor laser device according to a third embodiment of the present invention.

FIG. 9 illustrates results of measurement of a cutoff frequency of the semiconductor laser device shown in Table 3 with variation of the thickness t of a depletion enhancement layer 8. Referring to FIG. 9, ○ denotes a case of employing a depletion enhancement layer 8 of Al$_{0.07}$Ga$_{0.93}$N having a single-layer structure, and □ denotes a case of employing a depletion enhancement layer 8 of a superlattice structure alternately having Al$_{0.15}$Ga$_{0.85}$N barrier layers and Al$_{0.07}$Ga$_{0.93}$N well layers (the thickness t is the sum of the thicknesses of the well layers).

The cutoff frequency, 320 MHz when the semiconductor laser device is formed with no depletion enhancement layer 8, is gradually improved when the thickness t of the depletion enhancement layer 8 is increased, remarkably improved when the thickness t of the depletion enhancement layer 8 exceeds 10 nm, and substantially saturated when the thickness t is about 20 nm. Therefore, the thickness t of the depletion enhancement layer 8 is preferably at least 10 nm, and more preferably at least 20 nm saturating improvement of the cutoff frequency. When the thickness t of the depletion enhancement layer 8 is at least 15 nm, the intermediate level between 10 nm and 20 nm, the high-frequency characteristic can be sufficiently improved.

(4) Fourth Embodiment

Figure 10:
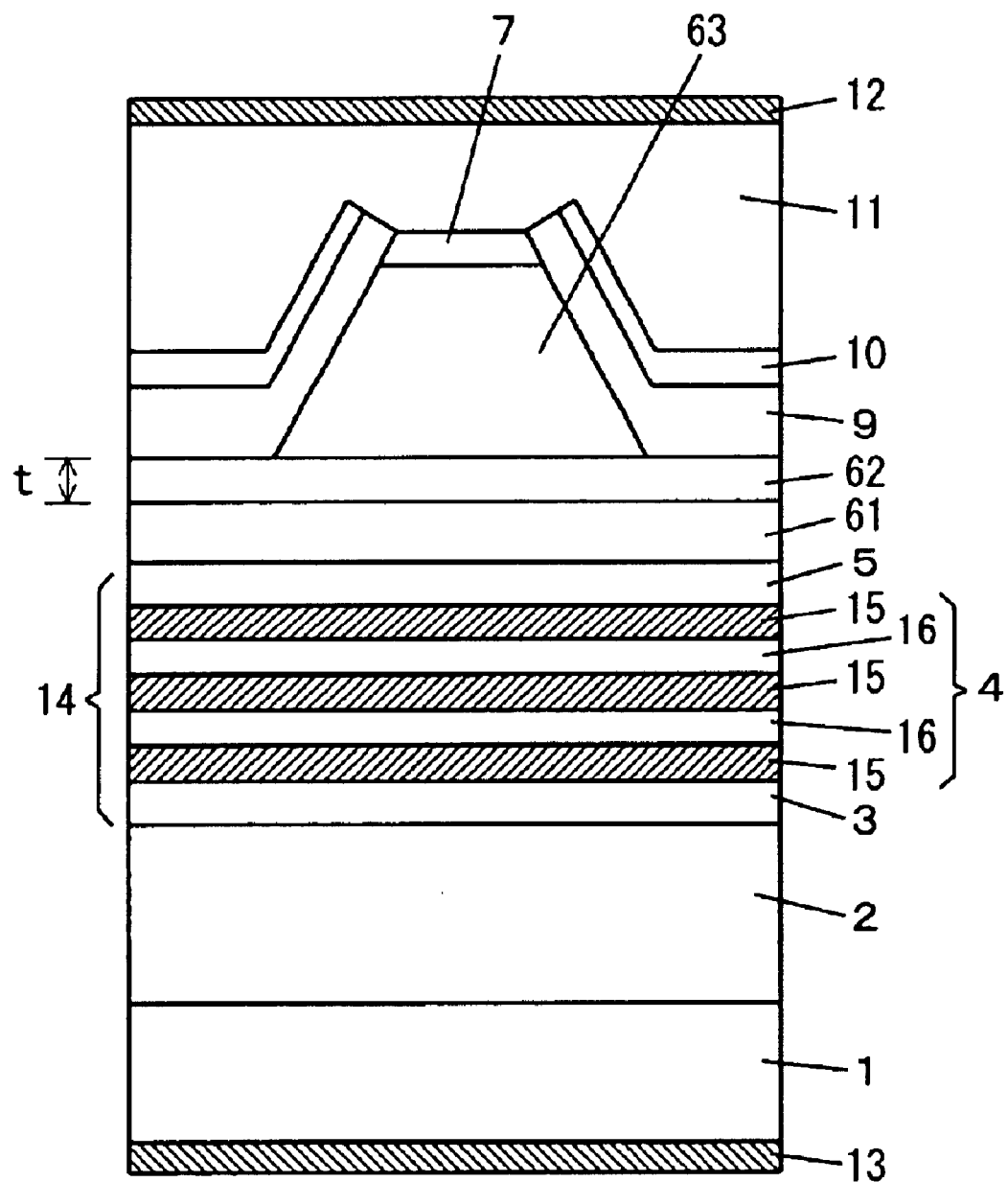
FIG. 10 is a typical sectional view of a semiconductor laser device according to a fourth embodiment of the present invention.

FIG. 10 is a typical sectional view showing a semiconductor laser device according to a fourth embodiment of the present invention.

In the semiconductor laser device shown in FIG. 10, respective layers 2 to 5 are formed on an n-GaAs substrate 1, similarly to the semiconductor laser device shown in FIG. 1.

A cladding layer 61 of p-(Al$_{0.7}$Ga$_{0.3}$)$_{0.5}$In$_{0.5}$P having a thickness of 200 nm and a depletion enhancement layer 62 of Ga$_{0.5}$In$_{0.5}$P are successively formed on the guide layer 5. The carrier concentration of the p-type cladding layer 61 is 3×10$^{17}$ cm$^{-3}$.

A cladding layer 63 of p-(Al$_{0.7}$Ga$_{0.3}$)$_{0.5}$In$_{0.5}$P of 1300 nm in thickness having a ridge shape is formed on the depletion enhancement layer 62. The carrier concentration of the p-type cladding layer 63 is 3×10$^{17}$ cm$^{-3}$. A contact layer 7 of p-Ga$_{0.5}$In$_{0.5}$P is formed on the upper surface of the p-type cladding layer 63.

A low carrier concentration layer 9 of GaAs of 1000 nm in thickness having a striped opening on the upper surface of the p-type contact layer 7 is formed on portions of the depletion enhancement layer 62 located on both sides of the p-type cladding layer 63 and on the side surfaces of the p-type cladding layer 63.

Further, a current blocking layer 10 of n-GaAs of 500 nm in thickness having a striped opening on the upper surface of the ridge portion is formed on the low carrier concentration layer 9. A p-type contact layer 11 is formed on the p-type contact layer 7 and the n-type current blocking layer 10.

Table 4 shows the aforementioned structure.

TABLE 4

| Name of Layer | | Composition and Name of Layer | Thickness (nm) | Carrier Concentration ($cm^{-3}$) | Numeral |
|---|---|---|---|---|---|
| | | n-GaAs substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | Quantum Well Active Layer | Guide Layer of $(Al_{0.5}Ga_{0.5})_{0.5}In_{0.5}P$ | 30 | | 3 |
| | | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 200 | $3 \times 10^{17}$ | 61 |
| | | Cladding Layer of p-$(Al_{0.7}Ga_{0.3})_{0.5}In_{0.5}P$ | 1300 | $3 \times 10^{17}$ | 63 |
| | | Contact Layer of p-$Ga_{0.5}In_{0.5}P$ | 200 | $2 \times 10^{18}$ | 7 |
| | | Depletion Enhancement Layer of $Ga_{0.5}In_{0.5}P$ | t | | 62 |
| | | Low Carrier Concentration Layer of GaAs | 1000 | | 9 |
| | | Current Blocking Layer of n-GaAs | 500 | $8 \times 10^{17}$ | 10 |
| | | Contact Layer of p-GaAs | 3000 | $3 \times 10^{19}$ | 11 |
| | | p-Electrode | 300 | | 12 |
| | | n-Electrode | 300 | | 13 |

Figure 11:
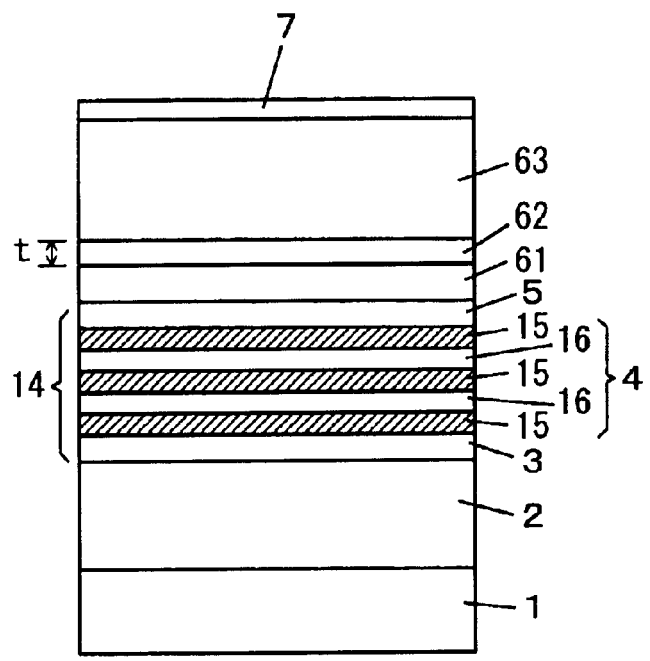
FIGS. 11 to 13 are typical sectional views showing steps in a method of fabricating the semiconductor laser device shown in FIG. 10.
Figure 12:
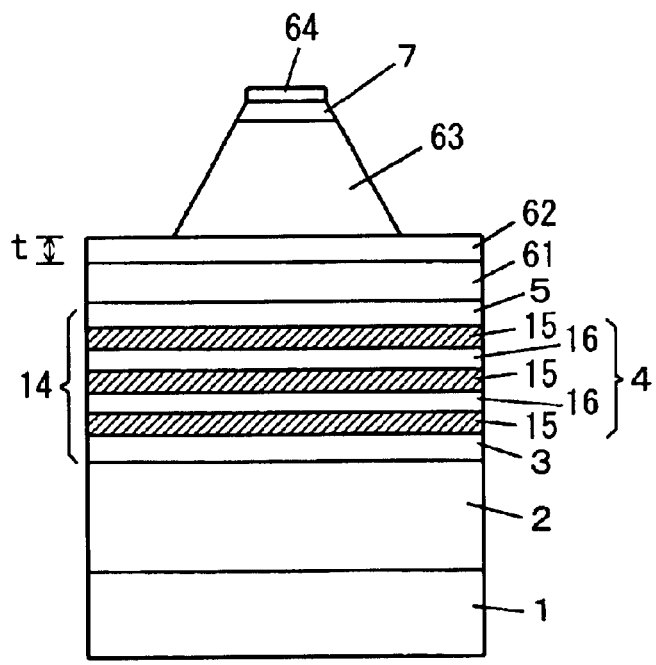
Figure 13:
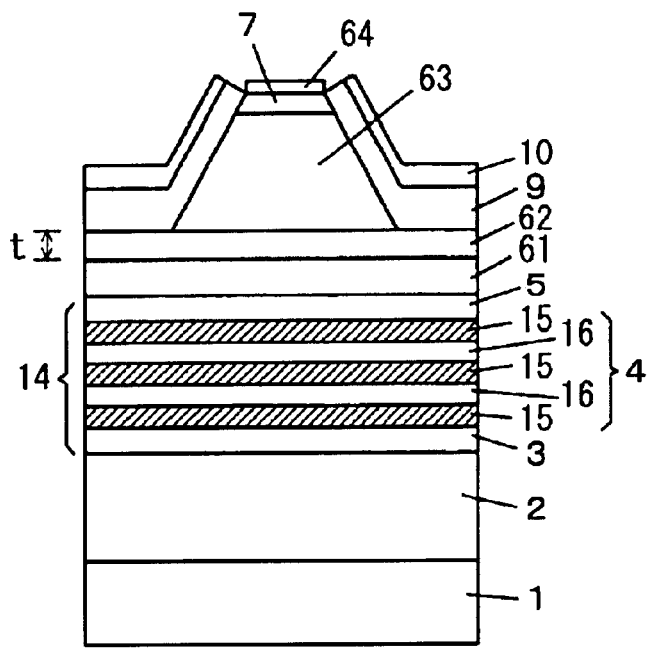

FIGS. 11, 12 and 13 are typical sectional views showing steps in a method of fabricating the semiconductor layer device shown in FIG. 10.

As shown in FIG. 11, the cladding layer 2 of n-$(Al_{0.7}Ga_{0.3})_{0.5}In_{0.5}P$, the guide layer 3 of $(Al_{0.5}Ga_{0.5})_{0.5}In_{0.5}P$, the quantum well active layer 4, the guide layer 5 of $(Al_{0.5}Ga_{0.5})_{0.5}In_{0.5}P$, the cladding layer 61 of $(Al_{0.7}Ga_{0.3})_{0.5}In_{0.5}P$, the depletion enhancement layer 62 of $Ga_{0.5}In_{0.5}P$, the cladding layer 63 of p-$(Al_{0.7}Ga_{0.3})_{0.5}In_{0.5}P$ and the contact layer 7 of p-$Ga_{0.5}In_{0.5}P$ are successively grown on the n-GaAs substrate 1 by MOCVD.

As shown in FIG. 12, an $SiO_2$ film is formed on the p-type contact layer 7 and patterned for forming a striped $SiO_2$ film 64. Thereafter the p-type contact layer 7 and the p-type cladding layer 63 are removed by etching through the $SiO_2$ film 64 serving as a mask, for forming the ridge portion.

As shown in FIG. 13, the low carrier concentration layer 9 of GaAs and the current blocking layer 10 of n-GaAs are successively grown on the side surfaces of the depletion enhancement layer 62 and the p-type cladding layer 63 located on both sides of the ridge portion by MOCVD through the $SiO_2$ film 64 serving as a selective growth mask.

The $SiO_2$ film 64 is removed and thereafter the contact layer 11 of p-GaAs is formed on the n-type current blocking layer 10 and the p-type contact layer 7 by MOCVD, while forming a p-electrode 12 of Cr/Au on the surface of the p-type contact layer 11 and forming an n electrode 13 of AuGe/Ni/Au on the back side of the n-GaAs substrate 1, as shown in FIG. 10.

Figure 14:
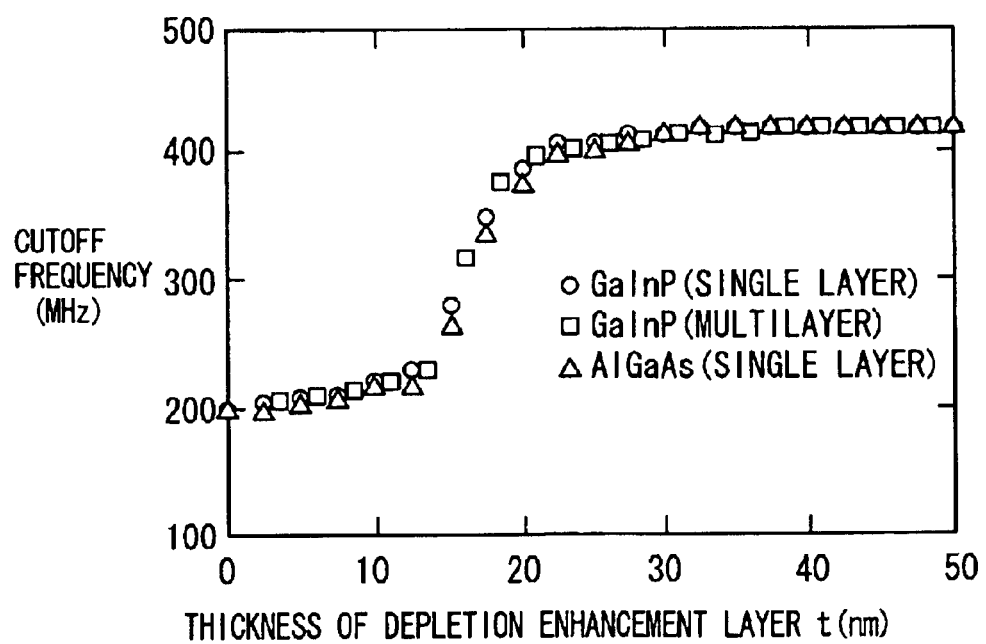
FIG. 14 is a diagram showing results of measurement of the relation between a cutoff frequency and the thickness of a depletion enhancement layer in the semiconductor laser device according to the fourth embodiment.

FIG. 14 is a diagram showing the results of measurement of a cutoff frequency of the semiconductor laser device shown in Table 4 with variation of the thickness t of the depletion enhancement layer 62. Referring to FIG. 14, ○ denotes a case of employing a depletion enhancement layer 62 of $Ga_{0.5}In_{0.5}P$ having a single-layer structure, denotes a case of employing a depletion enhancement layer 62 of a superlattice structure alternately having $(Al_{0.7}Ga_{0.3})_{0.5}In_{0.5}P$ barrier layers and $Ga_{0.5}In_{0.5}P$ well layers (the thickness t is the sum of the thicknesses of the well layers), and denotes a case of employing a depletion enhancement layer 62 of $Al_{0.45}Ga_{0.55}As$ having a single-layer structure respectively.

The cutoff frequency, 200 MHz when the semiconductor laser device is formed with no depletion enhancement layer 62, is gradually improved when the thickness t of the depletion enhancement layer 62 is increased, remarkably improved when the thickness t of the depletion enhancement layer 62 exceeds 15 nm, and substantially saturated when the thickness t is about 20 nm. Therefore, the thickness t of the depletion enhancement layer 62 is preferably at least 15 nm, and more preferably at least 20 nm saturating improvement of the cutoff frequency. When the thickness t of the depletion enhancement layer 62 is at least 18 nm, the intermediate level between 15 nm and 20 nm, the high-frequency characteristic can be sufficiently improved.

(5) Fifth Embodiment

A semiconductor laser device according to a fifth embodiment of the present invention is now described.

The structure of the semiconductor laser device according to the fifth embodiment is similar to that shown in FIG. 10, except the materials, thicknesses and carrier concentrations of respective layers. Table 5 shows the materials, thicknesses and carrier concentrations of the respective layers of the semiconductor laser device according to this embodiment.

TABLE 5

| Name of Layer | | Composition and Name of Layer | Thickness (nm) | Carrier Concentration ($cm^{-3}$) | Numeral |
|---|---|---|---|---|---|
| | | n-GaAs Substrate | | $1 \times 10^{18}$ | 1 |
| | | Cladding Layer of n-$Al_{0.45}Ga_{0.55}As$ | 1500 | $3 \times 10^{17}$ | 2 |
| Emission Layer | Quantum Well Active Layer | Guide Layer of $Al_{0.35}Ga_{0.65}As$ | 30 | | 3 |
| | | Quantum Well Layer of $Al_{0.1}Ga_{0.9}As$ | 5 | | 15 |
| | | Barrier Layer of $Al_{0.35}Ga_{0.65}As$ | 5 | | 16 |
| | | Guide Layer of $Al_{0.35}Ga_{0.65}As$ | 30 | | 5 |
| | | Cladding Layer of p-$Al_{0.45}Ga_{0.55}As$ | 200 | $1 \times 10^{18}$ | 61 |
| | | Cladding Layer of p-$Al_{0.45}Ga_{0.55}As$ | 1300 | $1 \times 10^{18}$ | 63 |
| | | Contact Layer of p-GaAs | 200 | $4 \times 10^{18}$ | 7 |
| | | Depletion Enhancement Layer of $Al_{0.25}Ga_{0.75}As$ | t | | 62 |
| | | Low Carrier Concentration Layer of GaAs | 1000 | | 9 |
| | | Current Blocking | 500 | $5 \times 10^{17}$ | 10 |

TABLE 5-continued

| Name of Layer | Composition and Name of Layer | Thickness (nm) | Carrier Concentration (cm$^{-3}$) | Numeral |
|---|---|---|---|---|
| | Layer of n-GaAs Contact Layer of p-GaAs | 3000 | 3 × 10$^{19}$ | 11 |
| | p-Electrode | 300 | | 12 |
| | n-Electrode | 300 | | 13 |

Figure 15:
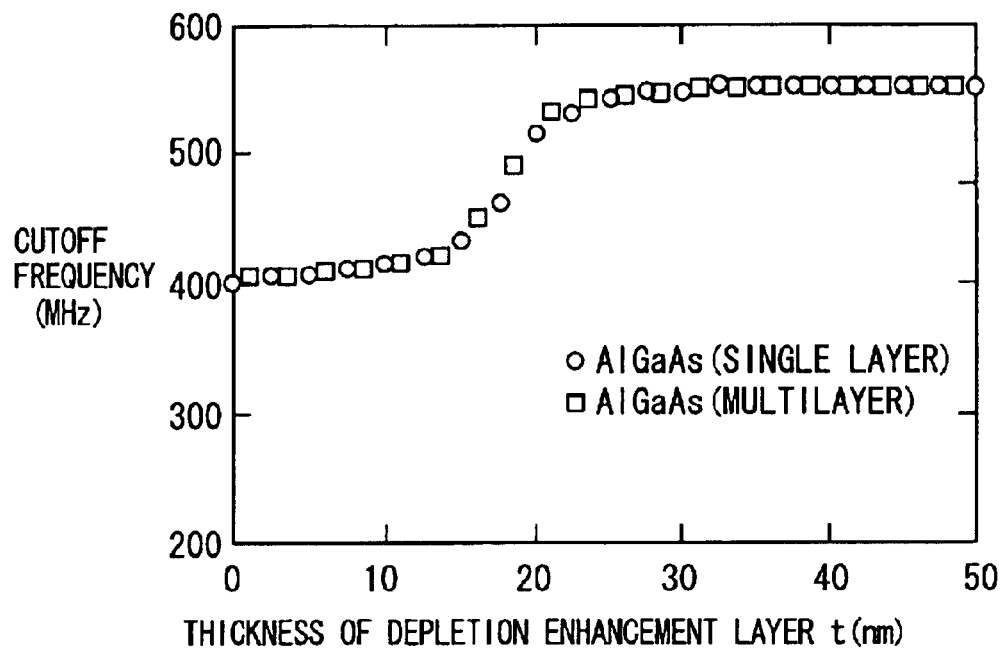
FIG. 15 is a diagram showing results of measurement of the relation between a cutoff frequency and the thickness of a depletion enhancement layer in a semiconductor laser device according to a fifth embodiment of the present invention.

FIG. 15 is a diagram showing the results of measurement of a cutoff frequency of the semiconductor laser device shown in Table 5 with variation of the thickness t of a depletion enhancement layer 62. Referring to FIG. 15, ○ denotes a case of employing a depletion enhancement layer 62 of Al$_{0.25}$Ga$_{0.75}$As having a single-layer structure, and □ denotes a case of employing a depletion enhancement layer 62 of a superlattice structure alternately having Al$_{0.45}$Ga$_{0.55}$As barrier layers and Al$_{0.25}$Ga$_{0.75}$As well layers (the thickness t is the sum of the thicknesses of the well layers) respectively.

The cutoff frequency, 400 MHz when the semiconductor laser device is formed with no depletion enhancement layer 62, is gradually improved when the thickness t of the depletion enhancement layer 62 is increased, remarkably improved when the thickness t of the depletion enhancement layer 62 exceeds 15 nm, and substantially saturated when the thickness t is about 20 nm. Therefore, the thickness t of the depletion enhancement layer 62 is preferably at least 15 nm, and more preferably at least 20 nm saturating improvement of the cutoff frequency. When the thickness t of the depletion enhancement layer 62 is at least 18 nm, the intermediate level between 15 nm and 20 nm, the high-frequency characteristic can be sufficiently improved.

(6) Sixth Embodiment

A semiconductor laser device according to a sixth embodiment of the present invention is now described.

The structure of the semiconductor laser device according to the sixth embodiment is similar to that shown in FIG. 10, except the materials, thicknesses and carrier concentrations of respective layers. Table 6 shows the materials, thicknesses and carrier concentrations of the respective layers of the semiconductor laser device according to this embodiment.

TABLE 6

| Name of Layer | | Composition and Name of Layer | Thickness (nm) | Carrier Concentration (cm$^{-3}$) | Numeral |
|---|---|---|---|---|---|
| | | n-GaN Substrate | | 1 × 10$^{18}$ | 1 |
| | | Cladding Layer of n-Al$_{0.15}$Ga$_{0.85}$N | 1000 | 3 × 10$^{17}$ | 2 |
| Emission Layer | | Guide Layer of GaN | 30 | | 3 |
| | Quantum Well Active Layer | Quantum Well Layer of In$_{0.15}$Ga$_{0.85}$N | 5 | | 15 |
| | | Barrier Layer of In$_{0.05}$Ga$_{0.95}$N | 5 | | 16 |
| | | Guide Layer of GaN | 30 | | 5 |
| | | Cladding Layer of p-Al$_{0.15}$Ga$_{0.85}$N | 100 | 2 × 10$^{17}$ | 61 |
| | | Cladding Layer of p-Al$_{0.15}$Ga$_{0.85}$N | 900 | 2 × 10$^{17}$ | 63 |
| | | First p-Contact Layer of p-GaN | 200 | 3 × 10$^{17}$ | 7 |
| | | Depletion Enhancement Layer of Al$_{0.07}$Ga$_{0.93}$N | t | | 62 |
| | | Low Carrier Concentration Layer of GaN | 800 | | 9 |
| | | Current Blocking Layer of n-GaN | 200 | 5 × 10$^{17}$ | 10 |
| | | Second p-Contact Layer of p-GaN | 3000 | 8 × 10$^{17}$ | 11 |
| | | p-Electrode | 300 | | 12 |
| | | n-Electrode | 300 | | 13 |

Figure 16:
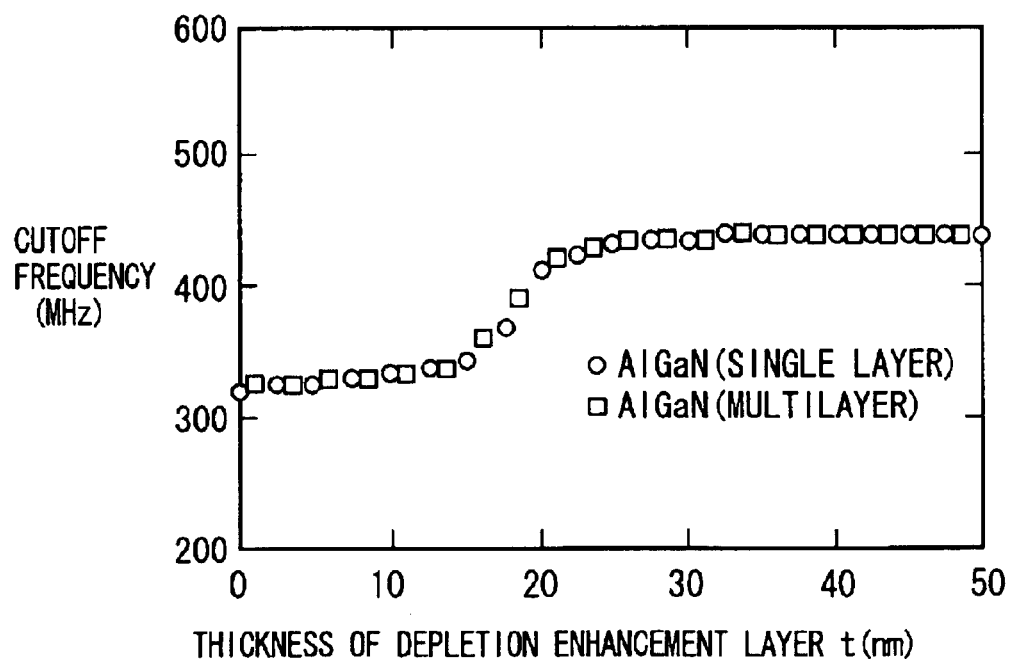
FIG. 16 is a diagram showing results of measurement of the relation between a cutoff frequency and the thickness of a depletion enhancement layer in a semiconductor laser device according to a sixth embodiment of the present invention.

FIG. 16 is a diagram showing the results of measurement of a cutoff frequency of the semiconductor laser device shown in Table 6 with variation of the thickness t of a depletion enhancement layer 62. Referring to FIG. 15, ○ denotes a case of employing a depletion enhancement layer 62 of Al$_{0.07}$Ga$_{0.93}$N having a single-layer structure, and □ denotes a case of employing a depletion enhancement layer 62 of a superlattice structure alternately having Al$_{0.15}$Ga$_{0.85}$N barrier layers and Al$_{0.07}$Ga$_{0.93}$N well layers (the thickness t is the sum of the thicknesses of the well layers) respectively.

The cutoff frequency, 320 MHz when the semiconductor laser device is formed with no depletion enhancement layer 62, is gradually improved when the thickness t of the depletion enhancement layer 62 is increased, remarkably improved when the thickness t of the depletion enhancement layer 62 exceeds 15 nm, and substantially saturated when the thickness t is about 20 nm. Therefore, the thickness t of the depletion enhancement layer 62 is preferably at least 15 nm, and more preferably at least 20 nm saturating improvement of the cutoff frequency. When the thickness t of the depletion enhancement layer 62 is at least 18 nm, the intermediate level between 15 nm and 20 nm, the high-frequency characteristic can be sufficiently improved.

(7) Seventh Embodiment

Figure 17:
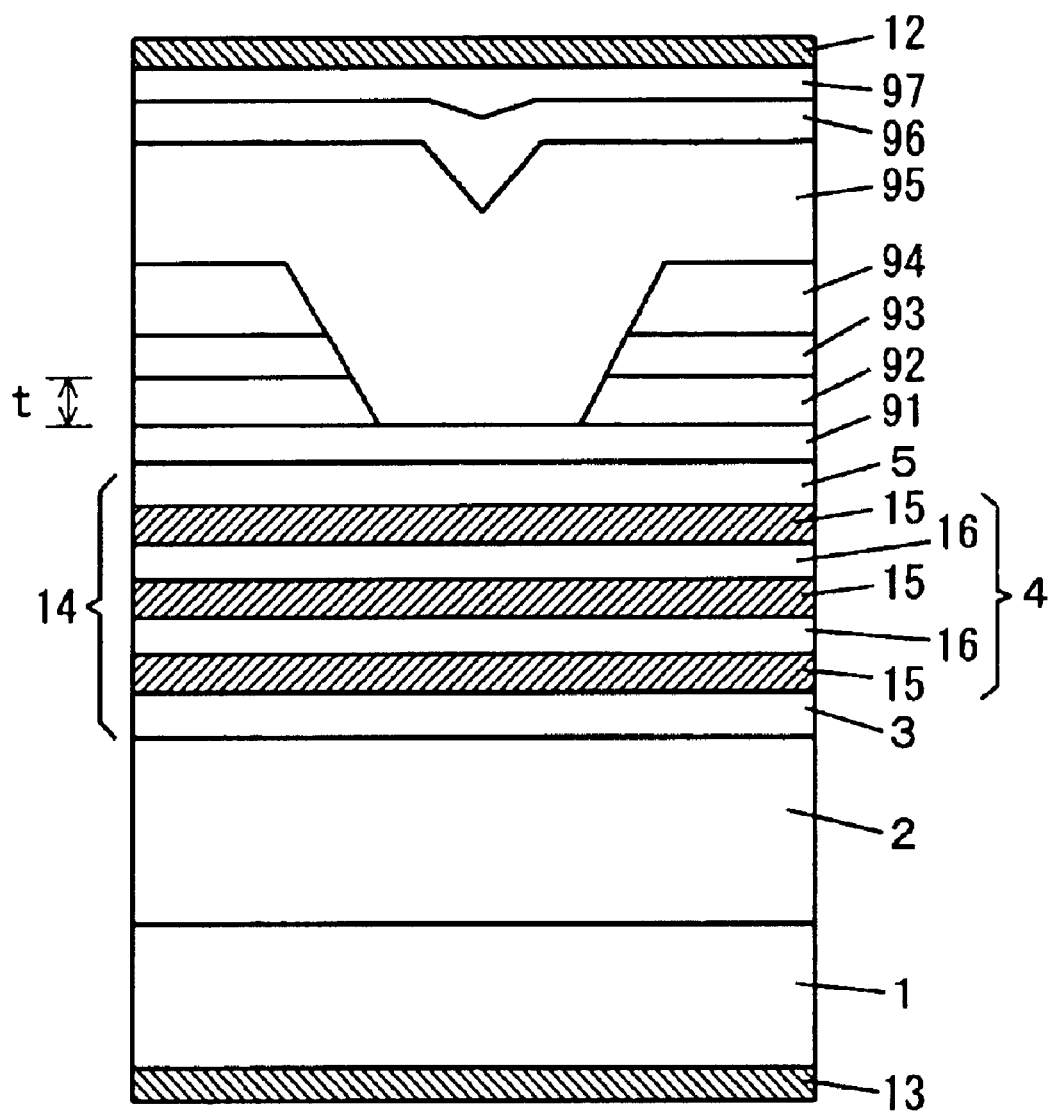
FIG. 17 is a typical sectional view of a semiconductor laser device according to a seventh embodiment of the present invention.

FIG. 17 is a typical sectional view of a semiconductor laser device according to a seventh embodiment of the present invention.

In the semiconductor laser device shown in FIG. 17, respective layers 2 to 5 are formed on an n-GaAs substrate 1, similarly to the semiconductor laser device shown in FIG. 1.

A cladding layer 91 of p-(Al$_{0.7}$Ga$_{0.3}$)$_{0.5}$In$_{0.5}$P having a thickness of 200 nm is formed on the guide layer 5. The carrier concentration of the p-type cladding layer 91 is 3×10$^{17}$ cm$^{-3}$.

A depletion enhancement layer 92 of Ga$_{0.5}$In$_{0.5}$P, a low carrier concentration 93 of GaAs having a thickness of 1000 nm and a current blocking layer 94 of n-GaAs having a thickness of 500 nm are successively formed on the p-type cladding layer 91.

Central regions of the depletion enhancement layer 92, the low carrier concentration layer 93 and the n-type current blocking layer 94 are removed to define a striped opening. The carrier concentration of the n-type current blocking layer 94 is 8×10$^{17}$ cm$^{-3}$. The carrier concentration of the low carrier concentration layer 93 is lower than that of the n-type current blocking layer 94.

A p-type cladding layer 95 p-(Al$_{0.7}$Ga$_{0.3}$)$_{0.5}$In$_{0.5}$P having a thickness of 1300 nm is formed on the p-type cladding layer 91 and the n-type current blocking layer 94 to fill up the striped opening. The carrier concentration of the p-type cladding layer 95 is $3 \times 10^{17}$ cm$^{-3}$.

A contact layer 96 of p-$Ga_{0.5}In_{0.5}P$ having a thickness of 200 nm is formed on the p-type cladding layer 95. A contact layer 97 of p-GaAs having a thickness of 3000 nm is formed on the p-type contact layer 96. The carrier concentration of the p-type contact layer 96 is $2 \times 10^{18}$ cm$^{-3}$. The carrier concentration of the p-type contact layer 97 is $3 \times 10^{19}$ cm$^{-3}$.

Table 7 shows the aforementioned structure.

TABLE 7

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | | Guide Layer of $(Al_{0.5}Ga_{0.5})_{0.5}In_{0.5}P$ | 30 | | 3 |
| | Quantum Well Active Layer | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 200 | $3 \times 10^{17}$ | 91 |
| | | Cladding Layer of p-$(Al_{0.7}Ga_{0.3})_{0.5}In_{0.5}P$ | 1300 | $3 \times 10^{17}$ | 95 |
| | | Depletion Enhancement Layer of $Ga_{0.5}In_{0.5}P$ | t | | 92 |
| | | Low Carrier Concentration Layer of GaAs | 1000 | | 93 |
| | | Current Blocking Layer of n-GaAs | 500 | $8 \times 10^{17}$ | 94 |
| | | Contact Layer of p-$Ga_{0.2}In_{0.5}P$ | 200 | $2 \times 10^{18}$ | 96 |
| | | Contact Layer of p-GaAs | 3000 | $3 \times 10^{19}$ | 97 |
| | | p-Electrode | 300 | | 12 |
| | | n-Electrode | 300 | | 13 |

FIGS. 18 and 19 are typical sectional views showing steps in a method of fabricating the semiconductor laser device shown in FIG. 17.

As shown in FIG. 18, the cladding layer 2 of n-$(Al_{0.7}Ga_{0.3})_{0.5}In_{0.5}P$, the guide layer 3 of $(Al_{0.5}Ga_{0.5})_{0.5}In_{0.5}P$ having a thickness of 30 nm, the quantum well active layer 4, the guide layer of $(Al_{0.5}Ga_{0.5})_{0.5}In_{0.5}P$ having a thickness of 30 nm, the cladding layer 91 of p-$(Al_{0.7}Ga_{0.3})_{0.5}In_{0.5}P$, the depletion enhancement layer 92 of $Ga_{0.5}In_{0.5}P$, the low carrier concentration layer 93 of GaAs and the current blocking layer 94 of n-GaAs are successively grown on the n-GaAs substrate 1 by MOCVD.

A mask (not shown) is formed on the n-type current blocking layer 94 and patterned to have a striped opening. Thereafter the central portions of the n-type current blocking layer 94, the low carrier concentration layer 93 and the depletion enhancement layer 92 are removed by etching for forming the striped opening, as shown in FIG. 19.

Then, the cladding layer 95 of p-$(Al_{0.7}Ga_{0.3})_{0.5}In_{0.5}P$, the contact layer 96 of p-$Ga_{0.5}In_{0.5}P$ and the contact layer 97 of p-GaAs are successively formed on the n-type current blocking layer 94 and on the p-type cladding layer 91 located in the striped opening by MOCVD, as shown in FIG. 17. A p-electrode 12 of Cr/Au is formed on the surface of the p-type contact layer 97, and an n electrode 13 of AuGe/Ni/Au is formed on the back side of the n-GaAs substrate 1.

Figure 20:
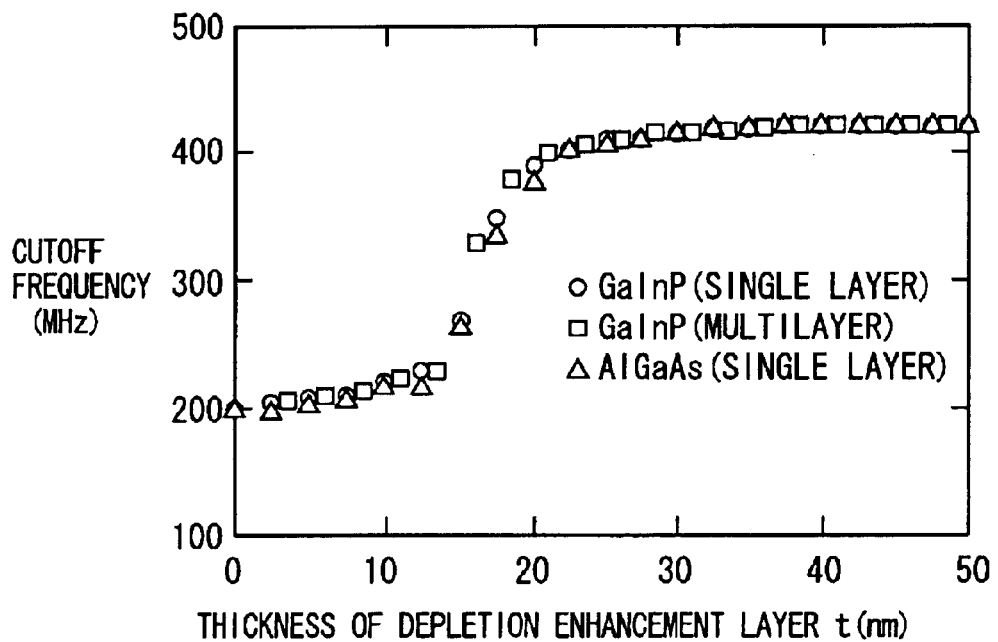
FIG. 20 is a diagram showing results of measurement of the relation between a cutoff frequency and the thickness of a depletion enhancement layer in the semiconductor laser device according to the seventh embodiment.

FIG. 20 is a diagram showing the results of measurement of a cutoff frequency of the semiconductor laser device shown in Table 7 with variation of the thickness t of the depletion enhancement layer 92. Referring to FIG. 20, ○ denotes a case of employing a depletion enhancement layer 92 of $Ga_{0.5}In_{0.5}P$ having a single-layer structure, □ denotes a case of employing a depletion enhancement layer 92 of a superlattice structure alternately having $(Al_{0.7}Ga_{0.3})_{0.5}In_{0.5}P$ barrier layers and $Ga_{0.5}In_{0.5}P$ well layers (the thickness t is the sum of the thicknesses of the well layers), and Δ denotes a case of employing a depletion enhancement layer 92 of $Al_{0.45}Ga_{0.55}As$ having a single-layer structure respectively.

The cutoff frequency, 200 MHz when the semiconductor laser device is formed with no depletion enhancement layer 92, is gradually improved when the thickness t of the depletion enhancement layer 92 is increased, remarkably improved when the thickness t of the depletion enhancement layer 92 exceeds 10 nm, and substantially saturated when the thickness t is about 20 nm. Therefore, the thickness t of the depletion enhancement layer 92 is preferably at least 15 nm, and more preferably at least 20 nm saturating improvement of the cutoff frequency. When the thickness t of the depletion enhancement layer 92 is at least 18 nm, the intermediate level between 15 nm and 20 nm, the high-frequency characteristic can be sufficiently improved.

(8) Eighth Embodiment

A semiconductor laser device according to an eighth embodiment of the present invention is now described.

The structure of the semiconductor laser device according to the eighth embodiment is similar to that shown in FIG. 17, except the materials, thicknesses and carrier concentrations of respective layers. Table 8 shows the materials, thicknesses and carrier concentrations of the respective layers in the semiconductor laser device according to this embodiment.

TABLE 8

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-$Al_{0.45}Ga_{0.55}As$ | 1500 | $3 \times 10^{17}$ | 2 |
| Emission Layer | | Guide Layer of $Al_{0.35}Ga_{0.65}As$ | 30 | | 3 |
| | Quantum Well Active Layer | Quantum Well Layer of $Al_{0.1}Ga_{0.9}As$ | 5 | | 15 |
| | | Barrier Layer of $Al_{0.35}Ga_{0.65}As$ | 5 | | 16 |
| | | Guide Layer of $Al_{0.35}Ga_{0.65}As$ | 30 | | 5 |
| | | Cladding Layer of p-$Al_{0.45}Ga_{0.55}As$ | 200 | $1 \times 10^{18}$ | 91 |
| | | Cladding Layer of p-$Al_{0.45}Ga_{0.55}As$ | 1300 | $1 \times 10^{18}$ | 95 |
| | | Depletion Enhancement Layer of $Al_{0.25}Ga_{0.75}As$ | t | | 92 |
| | | Low Carrier Concentration Layer of GaAs | 1000 | | 93 |
| | | Current Blocking Layer of n-GaAs | 500 | $5 \times 10^{17}$ | 94 |
| | | Contact Layer of p-GaAs | 200 | $4 \times 10^{18}$ | 96 |
| | | Contact Layer of | 3000 | $3 \times 10^{19}$ | 97 |

TABLE 8-continued

| Name of Layer | Composition and Name of Layer | Thickness (nm) | Carrier Concentration (cm$^{-3}$) | Numeral |
|---|---|---|---|---|
| | p-GaAs p-Electrode | 300 | | 12 |
| | n-Electrode | 300 | | 13 |

Figure 21:
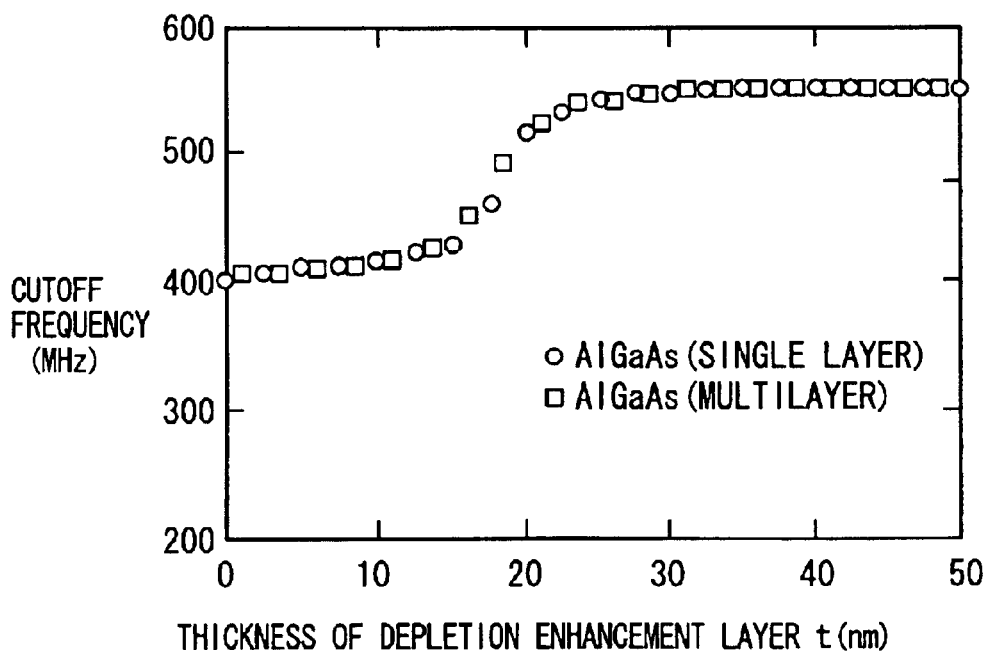
FIG. 21 is a diagram showing results of measurement of the relation between a cutoff frequency and the thickness of a depletion enhancement layer in a semiconductor laser device according to an eighth embodiment of the present invention.

FIG. 21 is a diagram showing the results of measurement of a cutoff frequency of the semiconductor laser device shown in Table 8 with variation of the thickness t of a depletion enhancement layer 92. Referring to FIG. 21, ○ denotes a case of employing a depletion enhancement layer 92 of $Al_{0.25}Ga_{0.75}As$ having a single-layer structure, and □ denotes a case of employing a depletion enhancement layer 92 of a superlattice structure alternately having $Al_{0.45}Ga_{0.75}As$ barrier layers and $Al_{0.25}Ga_{0.75}As$ well layers (the thickness t is the sum of the thicknesses of the well layers) respectively.

The cutoff frequency, 400 MHz when the semiconductor laser device is formed with no depletion enhancement layer 92, is gradually improved when the thickness t of the depletion enhancement layer 92 is increased, remarkably improved when the thickness t of the depletion enhancement layer 92 exceeds 15 nm, and substantially saturated when the thickness t is about 20 nm. Therefore, the thickness t of the depletion enhancement layer 92 is preferably at least 15 nm, and more preferably at least 20 nm saturating improvement of the cutoff frequency. When the thickness t of the depletion enhancement layer 92 is at least 18 nm, the intermediate level between 15 nm and 20 nm, the high-frequency characteristic can be sufficiently improved.

(9) Ninth Embodiment

A semiconductor laser device according to a ninth embodiment of the present invention is now described.

The structure of the semiconductor laser device according to the ninth embodiment is similar to that shown in FIG. 17, except the materials, thicknesses and carrier concentrations of respective layers. Table 9 shows the materials, thicknesses and carrier concentrations of the respective layers in the semiconductor laser device according to this embodiment.

TABLE 9

| Name of Layer | | Composition and Name of Layer | Thickness (nm) | Carrier Concentration (cm$^{-3}$) | Numeral |
|---|---|---|---|---|---|
| | | n-GaN Substrate | | 1 × 10$^{18}$ | 1 |
| | | Cladding Layer of n-$Al_{0.15}Ga_{0.85}N$ | 1000 | 3 × 10$^{17}$ | 2 |
| Emission Layer | Quantum Well Active Layer | Guide Layer of GaN | 30 | | 3 |
| | | Quantum Well Layer of $In_{0.15}Ga_{0.85}N$ | 5 | | 15 |
| | | Barrier Layer of $In_{0.05}Ga_{0.95}N$ | 5 | | 16 |
| | | Guide Layer of GaN | 30 | | 5 |
| | | Cladding Layer of p-$Al_{0.15}Ga_{0.85}N$ | 100 | 2 × 10$^{17}$ | 91 |
| | | Cladding Layer of p-$Al_{0.15}Ga_{0.85}N$ | 900 | 2 × 10$^{17}$ | 95 |
| | | Depletion Enhancement Layer of $Al_{0.07}Ga_{0.93}N$ | t | | 92 |
| | | Low Carrier Concentration Layer | 800 | | 93 |

TABLE 9-continued

| Name of Layer | Composition and Name of Layer | Thickness (nm) | Carrier Concentration (cm$^{-3}$) | Numeral |
|---|---|---|---|---|
| | of GaN Current Blocking Layer of n-GaN | 200 | 5 × 10$^{17}$ | 94 |
| | First Contact Layer of p-GaN | 200 | 3 × 10$^{17}$ | 96 |
| | Second Contact Layer of p-GaN | 3000 | 8 × 10$^{17}$ | 97 |
| | p-Electrode | 300 | | 12 |
| | n-Electrode | 300 | | 13 |

Figure 22:
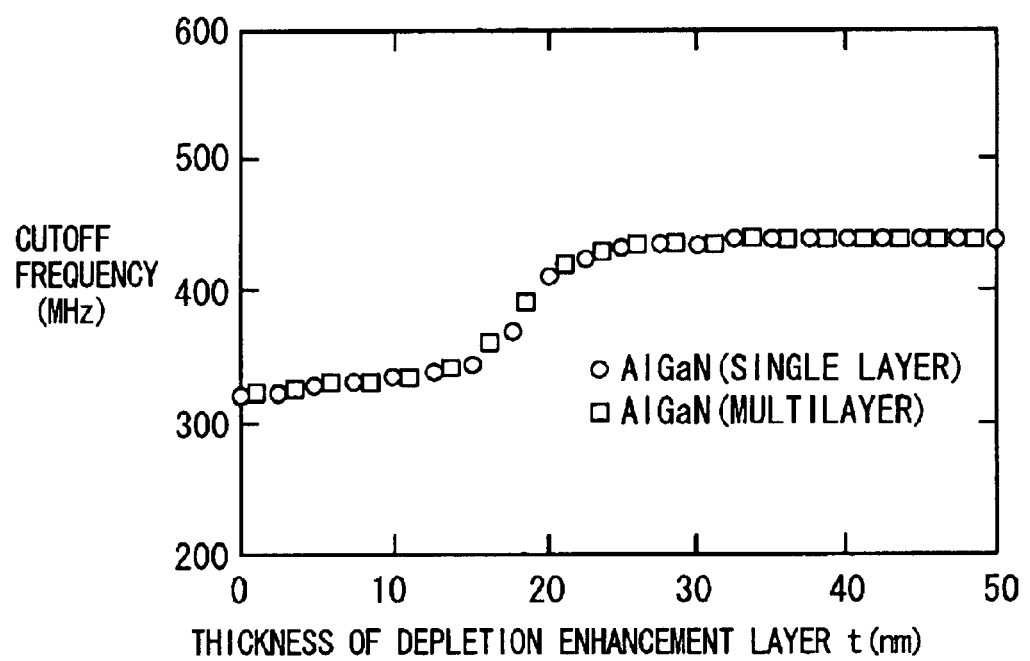
FIG. 22 is a diagram showing results of measurement of the relation between a cutoff frequency and the thickness of a depletion enhancement layer in a semiconductor laser device according to a ninth embodiment of the present invention.

FIG. 22 is a diagram showing the results of measurement of a cutoff frequency of the semiconductor laser device shown in Table 9 with variation of the thickness t of a depletion enhancement layer 92. Referring to FIG. 22, ○ denotes a case of employing a depletion enhancement layer 92 of $Al_{0.07}Ga_{0.93}N$ having a single-layer structure, and □ denotes a case of employing a depletion enhancement layer 92 of a superlattice structure alternately having $Al_{0.15}Ga_{0.85}N$ barrier layers and $Al_{0.07}Ga_{0.93}N$ well layers (the thickness t is the sum of the thicknesses of the well layers) respectively.

The cutoff frequency, 320 MHz when the semiconductor laser device is formed with no depletion enhancement layer 92, is gradually improved when the thickness t of the depletion enhancement layer 92 is increased, remarkably improved when the thickness t of the depletion enhancement layer 92 exceeds 15 nm, and substantially saturated when the thickness t is about 20 nm. Therefore, the thickness t of the depletion enhancement layer 92 is preferably at least 15 nm, and more preferably at least 20 nm saturating improvement of the cutoff frequency. When the thickness t of the depletion enhancement layer 92 is at least 18 nm, the intermediate level between 15 nm and 20 nm, the high-frequency characteristic can be sufficiently improved.

The materials for the active layer, the depletion enhancement layer, the low carrier concentration layer and the current blocking layer are not restricted to those in the aforementioned embodiments. For example, any arbitrary combination of an active layer of $(Al_{x1}Ga_{1-x1})_{y1}In_{1-y1}P$, a depletion enhancement layer of $(Al_{x2}Ga_{1-x2})_{y2}In_{1-y2}P$ or $Al_{x2}Ga_{1-x2}As$, a low carrier concentration layer of $(Al_{x3}Ga_{1-x3})_{y3}In_{1-y3}P$ or $Al_{x3}Ga_{1-x3}As$ and a current blocking layer of $(Al_{x4}Ga_{1-x4})_{y4}In_{1-y4}P$ or $Al_{x4}Ga_{1-x4}As$ can be employed. Each of x1, x2, x3, x4, y1, y2, y3 and y4 is at least zero and not more than 1.

(10) Tenth Embodiment

Figure 23:
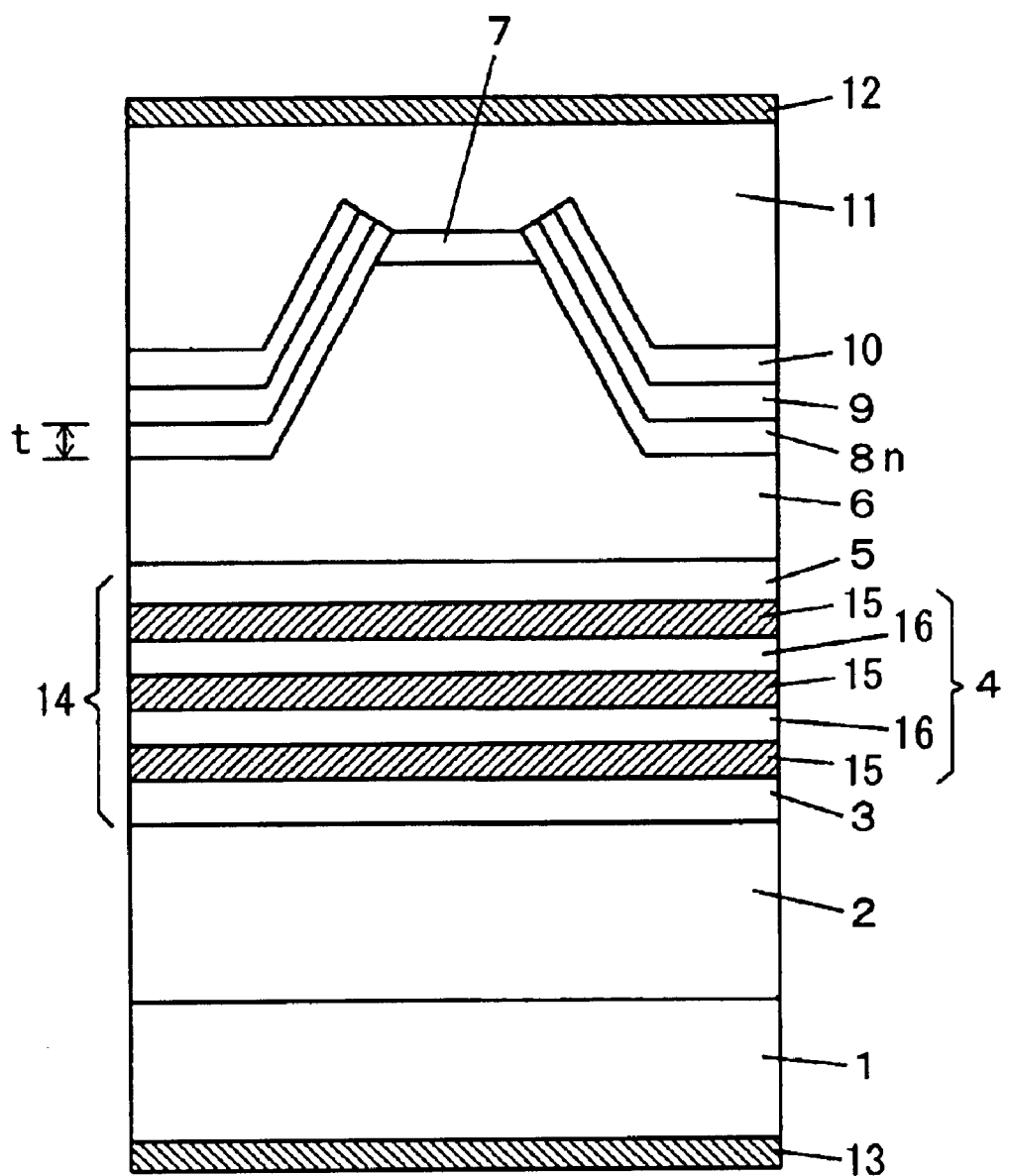
FIG. 23 is a typical sectional view of a semiconductor laser device according to each of tenth to twelfth embodiments of the present invention.

FIG. 23 is a typical sectional view of a semiconductor laser device according to a tenth embodiment of the present invention.

In the semiconductor laser device shown in FIG. 23, a cladding layer 2 of n-$(Al_{0.7}Ga_{0.3})_{0.5}In_{0.5}P$ having a thickness of 1500 nm and an emission layer 14 described later are successively formed on an n-GaAs substrate 1. A cladding layer 6 of p-$(Al_{0.7}Ga_{0.3})_{0.5}In_{0.5}P$ having a thickness of 1500 nm and a contact layer 7 of p-$Ga_{0.5}In_{0.5}P$ having a thickness of 200 nm are successively formed on the emission layer 14. The p-type cladding layer 6 and the p-type contact layer 7 are etched for defining a ridge portion.

The carrier concentration of the n-GaAs substrate 1 is 1×10$^{18}$ cm$^{-3}$, the carrier concentration of the n-type cladding layer 2 is 3×10$^{17}$ cm$^{-3}$, the carrier concentration of the p-type cladding layer 6 is 3×10$^{17}$ cm$^{-3}$, and the carrier concentration of the p-type contact layer 7 is 2×10$^{18}$ cm$^{-3}$.

Further, a n-type depletion enhancement layer 8n of n-GaAs having a thickness t, having a striped opening on the upper surface of the ridge portion, is formed on the p-type cladding layer 6. A first current blocking layer 9 of undoped GaAs of 1000 nm in thickness having a low carrier concentration, having a striped opening on the upper surface of the ridge portion, is formed on the n-type depletion enhancement layer 8. A reverse conduction type second current blocking layer 10 of n-GaAs of 500 nm in thickness having a striped opening on the upper surface of the ridge portion is formed on the first current blocking layer 9 having a low carrier concentration. The carrier concentration of the n-type depletion enhancement layer 8n is $5 \times 10^{17}$ cm$^{-3}$. The carrier concentration of the second current blocking layer 10 is $8 \times 10^{17}$ cm$^{-3}$.

A contact layer 11 of p-GaAs having a thickness of 3000 nm is formed on the p-type contact layer 7 located in the striped opening of the second current blocking layer 10 and on the second current blocking layer 10. The carrier concentration of the p-type contact layer 11 is $3 \times 10^{19}$ cm$^{-3}$. A p-electrode 12 having a thickness of 300 nm is formed on the p-type contact layer 11. An n electrode 13 having a thickness of 300 nm is formed on the back side of the n-GaAs substrate 1. Thus, the semiconductor laser device shown in FIG. 23 has a ridge guided structure.

The emission layer 14 includes a guide layer 3 of $(Al_{0.5}Ga_{0.5})_{0.5}In_{0.5}P$ having a thickness of 30 nm formed on the n-type cladding layer 2, a quantum well active layer 4 formed on the guide layer 3 and a guide layer 5 of $(Al_{0.5}Ga_{0.5})_{0.5}In_{0.5}P$ having a thickness of 30 nm formed on the quantum well layer 4.

The quantum well active layer 4 has a superlattice structure formed by alternately stacking a plurality of quantum well layers 15 of $Ga_{0.5}In_{0.5}P$ each having a thickness of 5 nm and a plurality of barrier layers 16 of $(Al_{0.5}Ga_{0.5})_{0.5}In_{0.5}P$ each having a thickness of 5 nm. For example, the number of the barrier layers 16 is 2, and the number of the quantum well layers 15 is 3.

Table 10 shows the aforementioned structure.

TABLE 10

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | | Guide Layer of $(Al_{0.5}Ga_{0.5})_{0.5}In_{0.5}P$ | 30 | | 3 |
| | Quantum Well Active Layer | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 1500 | $3 \times 10^{17}$ | 6 |
| | | Contact Layer of p-$Ga_{0.5}In_{0.5}P$ | 200 | $2 \times 10^{18}$ | 7 |
| | | Depletion Enhancement Layer of n-GaAs | t | $5 \times 10^{17}$ | 8n |
| | | First Current Blocking Layer Having a Low Carrier Concentration of GaAs | 1000 | | 9 |
| | | Second Current Blocking Layer of n-GaAs | 500 | $8 \times 10^{17}$ | 10 |
| | | Contact Layer of p-GaAs | 3000 | $3 \times 10^{19}$ | 11 |
| | | p-Electrode | 300 | | 12 |
| | | n-Electrode | 300 | | 13 |

Figure 24:
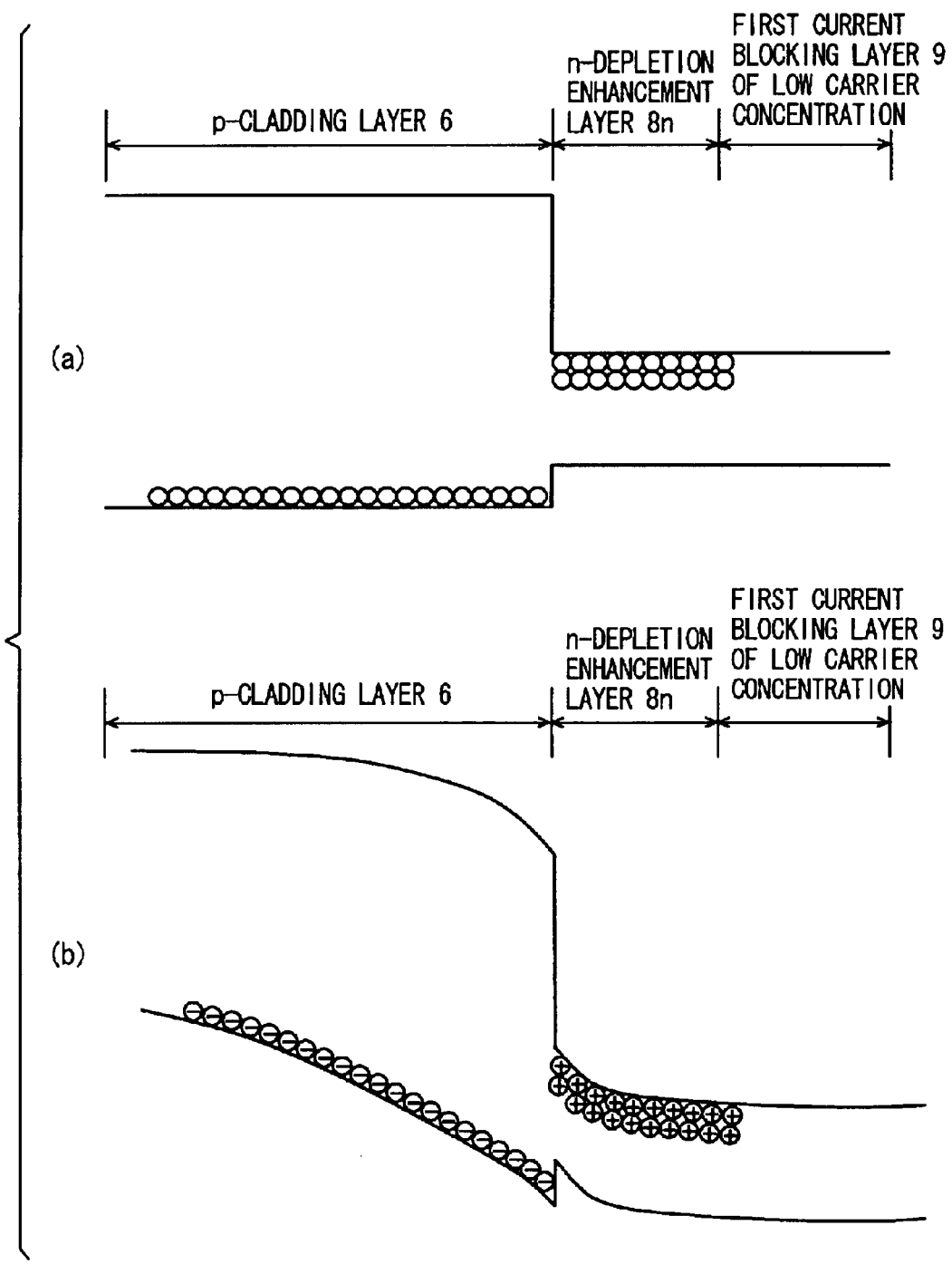
FIGS. 24(a) and 24(b) are energy band diagrams of a p-type cladding layer, a n-type depletion enhancement layer and a first current blocking layer having a low carrier concentration in the semiconductor laser device shown in FIG. 23.

FIGS. 24(a) and 24(b) typically show energy band diagrams of the p-type cladding layer 6, the n-type depletion enhancement layer 8 and the first current blocking layer 9 having a low carrier concentration in the semiconductor laser device shown in FIG. 23.

As shown in FIG. 24(a), the n-type depletion enhancement layer 8n formed with impurity levels of the opposite conduction type to the p-type cladding layer 6, i.e., donor levels, is formed between the p-type cladding layer 6 and the first current blocking layer 9 having a low carrier concentration.

In this case, the band gap of the n-type depletion enhancement layer 8n and that of the first current blocking layer 9 having a low carrier concentration are equal to each other, and the band gaps of these layers 8n and 9 are smaller than that of the p-type cladding layer 6.

As shown in FIG. 24(b), carriers supplied from the donor levels formed on the n-type depletion enhancement layer 8n compensate for carriers supplied from the p-type cladding layer 6. Therefore, the quantity of carriers stored in the first current blocking layer 9 having a low carrier concentration is reduced.

The first current blocking layer 9 having a low carrier concentration is kept in a depleted state due to such reduction of the quantity of carriers stored therein, whereby electric capacitance generated between the first current blocking layer 9 having a low carrier concentration and the p-type cladding layer 6 can be reduced for sufficiently increasing the operating speed of the semiconductor laser device. Thus, the high-frequency characteristic of the semiconductor laser device shown in FIG. 23 is readily improved by forming the n-type depletion enhancement layer 8 formed with the impurity levels of the opposite conduction type to the p-type cladding layer 6 between the p-type cladding layer 6 and the first current blocking layer 9 having a low carrier concentration.

Figure 25:
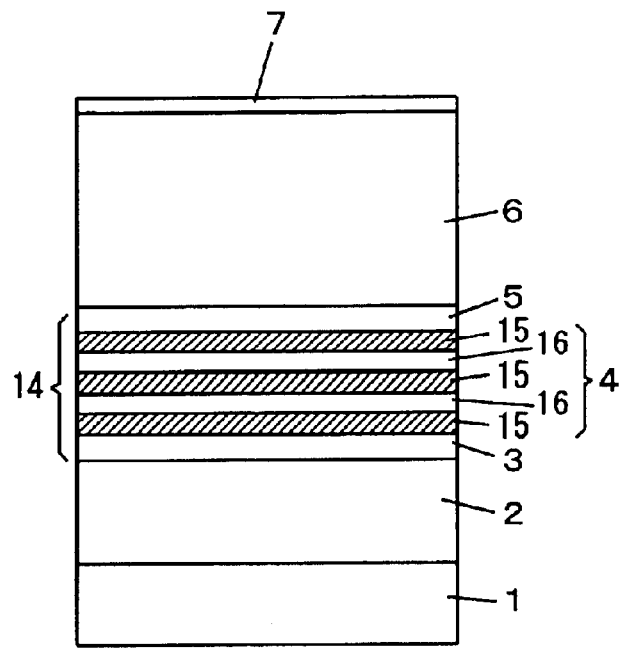
FIGS. 25 to 27 are typical sectional views showing steps in a method of fabricating the semiconductor laser device shown in FIG. 23.
Figure 26:
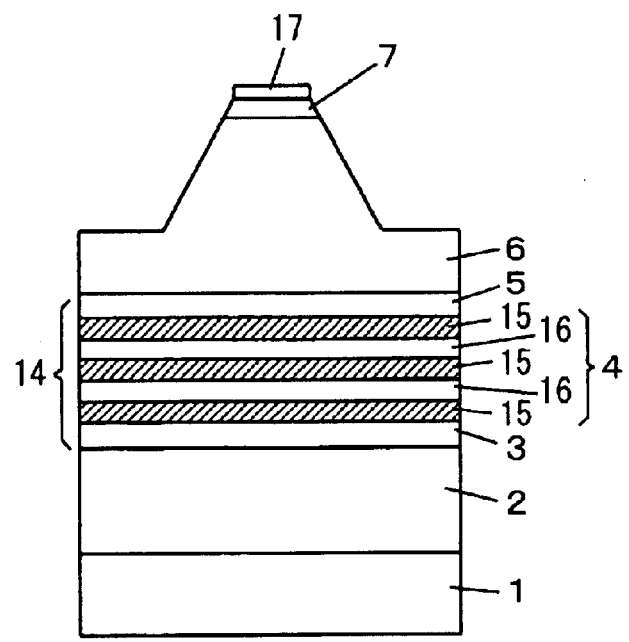
Figure 27:
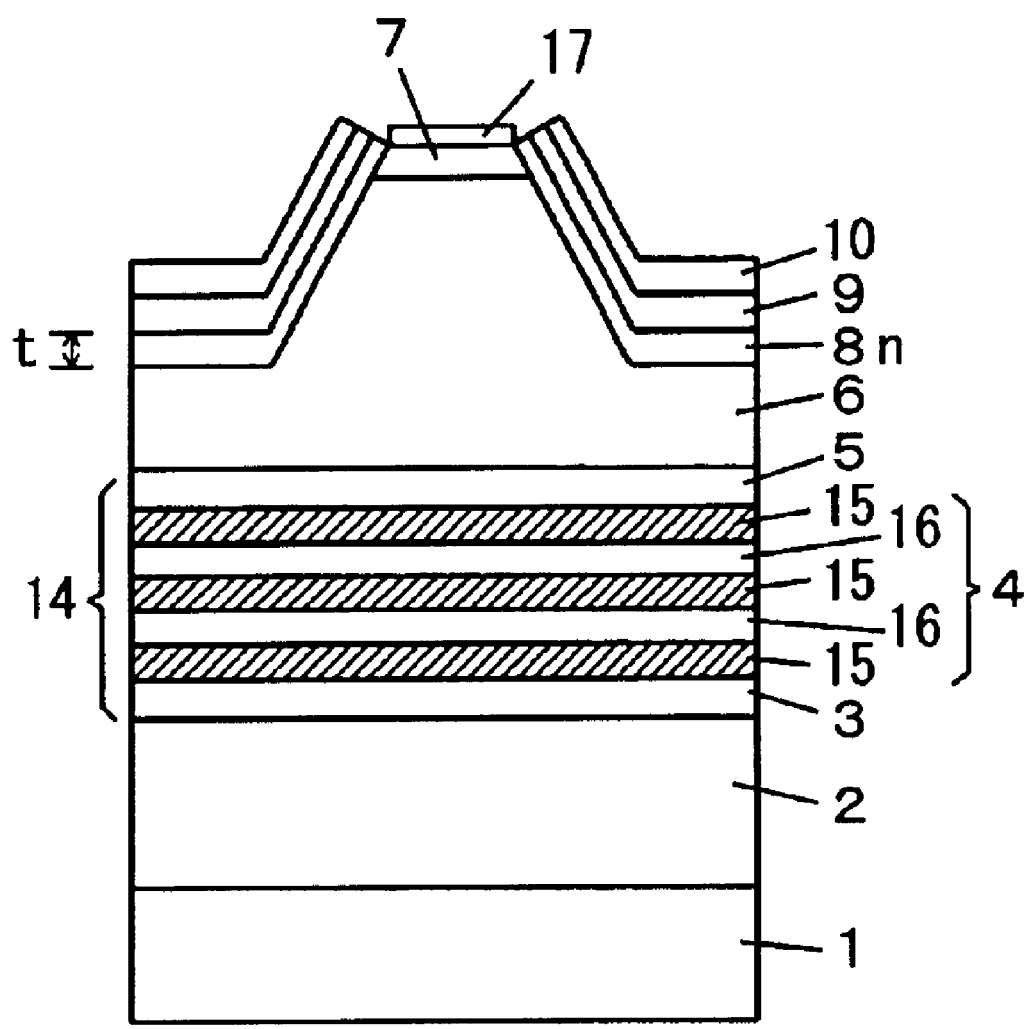

FIGS. 25, 26 and 27 are typical sectional views showing steps in a method of fabricating the semiconductor laser device shown in FIG. 23.

As shown in FIG. 25, the cladding layer 2 of n-$(Al_{0.7}Ga_{0.3})_{0.5}In_{0.5}P$, the guide layer 3 of $(Al_{0.5}Ga_{0.5})_{0.5}In_{0.5}P$, the quantum well active layer 4, the guide layer 5 of $(Al_{0.5}Ga_{0.5})_{0.5}In_{0.5}P$, the cladding layer 6 of p-$(Al_{0.7}Ga_{0.3})_{0.5}In_{0.5}P$ and the contact layer 7 of p-$Ga_{0.5}In_{0.5}P$ are successively formed on the n-GaAs substrate 1 by MOCVD.

As shown in FIG. 26, an $SiO_2$ film is formed on the p-type contact layer 7 and patterned for forming a striped $SiO_2$ film 17. Thereafter the p-type contact layer 7 and the p-type cladding layer 6 are partially removed by etching through the $SiO_2$ film 17 serving as a mask, for defining the ridge portion.

As shown in FIG. 27, the depletion enhancement layer 8n of n-GaAs, the first current blocking layer 9 of undoped GaAs having a low carrier concentration and the second current blocking layer 10 of n-GaAs are successively formed on the p-type cladding layer 6 by MOCVD through the $SiO_2$ film 17 serving as a selective growth mask.

The $SiO_2$ film 17 is removed and thereafter the contact layer 11 of p-GaAs is formed on the second current blocking layer 10 and the p-type contact layer 7 by MOCVD, while the p-electrode 12 of Cr/Au is formed on the surface of the p-type contact layer 11 and the n electrode 13 of AuGe/Ni/Au is formed on the back side of the n-GaAs substrate 1 as shown in FIG. 23.

In the semiconductor laser device shown in FIG. 23, the thickness t of the depletion enhancement layer 8n having a carrier concentration of $5 \times 10^{17}$ cm$^{-3}$ is varied for measuring the cutoff frequency of the semiconductor laser device at each level of the thickness t. Consequently, it is proved that the cutoff frequency is remarkably improved when the thickness t of the n-type depletion enhancement layer 8n is in the range of 20 to 35 nm.

Further, the thickness t of the n-type depletion enhancement layer 8n is set to 30 nm and the carrier concentration thereof is varied for measuring the cutoff frequency of the semiconductor laser device at each level of the carrier concentration. Consequently, it is provided that the cutoff frequency is remarkably improved when the carrier concentration of the n-type depletion enhancement layer 8n is in the range of $3 \times 10^{17}$ to $6 \times 10^{17}$ cm$^{-3}$.

(11) Eleventh Embodiment

A semiconductor laser device according to an eleventh embodiment of the present invention is now described.

The structure of the semiconductor laser device according to the eleventh embodiment is similar to that shown in FIG. 23, except the materials, thicknesses and carrier concentrations of respective layers. Table 11 shows the materials, thicknesses and carrier concentrations of the respective layers of the semiconductor laser device according to this embodiment.

TABLE 11

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-Al$_{0.45}$Ga$_{0.55}$As | 1500 | $3 \times 10^{17}$ | 2 |
| Emission Layer | | Guide Layer of Al$_{0.35}$Ga$_{0.65}$As | 30 | | 3 |
| | Quantum Well Active Layer | Quantum Well Layer of Al$_{0.1}$Ga$_{0.9}$As | 5 | | 15 |
| | | Barrier Layer of Al$_{0.35}$Ga$_{0.65}$As | 5 | | 16 |
| | | Guide Layer of Al$_{0.35}$Ga$_{0.65}$As | 30 | | 5 |
| | | Cladding Layer of p-Al$_{0.45}$Ga$_{0.55}$As | 1500 | $1 \times 10^{18}$ | 6 |
| | | Contact Layer of p-GaAs | 200 | $4 \times 10^{18}$ | 7 |
| | | Depletion Enhancement Layer of n-Al$_{0.25}$Ga$_{0.75}$As | t | $5 \times 10^{17}$ | 8n |
| | | First Current Blocking Layer Having a Low Carrier Concentration of GaAs | 1000 | | 9 |
| | | Second Current Blocking Layer of n-GaAs | 500 | $5 \times 10^{17}$ | 10 |
| | | Contact Layer of p-GaAs | 3000 | $3 \times 10^{19}$ | 11 |
| | | p-Electrode | 300 | | 12 |
| | | n-Electrode | 300 | | 13 |

As shown in Table 11, an n-type depletion enhancement layer 8n formed with impurity levels (donor levels) of the opposite conduction type to a p-type cladding layer 6 is formed between the p-type cladding layer 6 and a first current blocking layer 9 having a low carrier concentration in the semiconductor laser device according to this embodiment. In this embodiment, therefore, carriers supplied from the donor levels formed on the n-type depletion enhancement layer 8n compensate for those supplied from the p-type cladding layer 6, similarly to the tenth embodiment. Therefore, the quantity of carriers stored in the first current blocking layer 9 having a low carrier concentration is reduced.

The first current blocking layer 9 having a low carrier concentration is kept in a depleted state due to such reduction of the quantity of carriers stored therein, whereby electric capacitance generated between the first current blocking layer 9 having a low carrier concentration and the p-type cladding layer 6 can be reduced for sufficiently increasing the operating speed of the semiconductor laser device. Thus, the high-frequency characteristic of the semiconductor laser device is readily improved in this embodiment.

According to this embodiment, the semiconductor laser device is so set that the band gap of the n-type depletion enhancement layer 8n is smaller than that of the p-type cladding layer 6 and larger than that of the first current blocking layer 9 having a low carrier concentration. The n-type depletion enhancement layer 8n according to this embodiment also has a function as an intermediate band gap layer described later with reference to a thirteenth embodiment.

In this case, the band gaps of the p-type cladding layer 6, the n-type depletion enhancement layer 8n and the first current blocking layer 9 having a low carrier concentration are reduced in this order. Therefore, the band offset between the p-type cladding layer 6 and the n-type depletion enhancement layer 8n is smaller than that between the p-type cladding layer 6 and the first current blocking layer 9 having a low carrier concentration. Thus, carriers are hardly injected from the p-type cladding layer 6 into the n-type depletion enhancement layer 8n, and hardly injected into the first current blocking layer 9 having a low carrier concentration either. In this case, further, carriers are injected into both of the n-type depletion enhancement layer 8n and the first current blocking layer 9 having a low carrier concentration in a divided manner, whereby the quantity of carriers injected into the first current blocking layer 9 having a low carrier concentration is reduced.

As hereinabove described, the quantity of carriers stored in the first current blocking layer 9 having a low carrier concentration can be further reduced by forming the n-type depletion enhancement layer 8n having the intermediate band gap between the p-type cladding layer 6 and the first current blocking layer 9 having a low carrier concentration.

Thus, electric capacitance generated between the first current blocking layer 9 having a low carrier concentration and the p-type cladding layer 6 can be further reduced in the embodiment having the n-type depletion enhancement layer 8n, having the intermediate band gap between the p-type cladding layer 6 and the first current blocking layer 9 having a low carrier concentration, whereby the operating speed of the semiconductor laser device is further improved.

In the semiconductor laser device according to this embodiment, the thickness t of the n-type depletion enhancement layer 8n having a carrier concentration of $5 \times 10^{17}$ cm$^{-3}$ is varied for measuring the cutoff frequency of the semiconductor laser device at each level of the thickness t. Consequently, it is proved that the cutoff frequency is remarkably improved when the thickness t of the n-type depletion enhancement layer 8n is in the range of 10 to 40 nm.

Further, the thickness t of the n-type depletion enhancement layer 8n is set to 25 nm and the carrier concentration thereof is varied for measuring the cutoff frequency of the semiconductor laser device at each level of the carrier concentration. Consequently, it is proved that the cutoff frequency is remarkably improved when the carrier concentration of the n-type depletion enhancement layer 8n is in the range of $2.5 \times 10^{17}$ to $8.5 \times 10^{17}$ cm$^{-3}$.

As understood from the aforementioned results, the n-type depletion enhancement layer 8n has the intermediate band gap between the p-type cladding layer 6 and the first current blocking layer 9 having a low carrier concentration in this embodiment, whereby the ranges of the thickness and the carrier concentration of the n-type depletion enhancement layer 8n capable of remarkably improving the cutoff frequency of the semiconductor laser device are widened as compared with the first embodiment provided with the n-type depletion enhancement layer 8 and the first current blocking layer 9 of a low carrier concentration having the same band gaps. Thus, the thickness and the carrier concentration of the n-type depletion enhancement layer 8n can be readily set and the n-type depletion enhancement layer 8n can be readily prepared.

In the semiconductor laser device according to this embodiment, an undoped layer may be formed between the n-type depletion enhancement layer 8n and the p-type cladding layer 6. Alternatively, an undoped layer may be formed between the n-type depletion enhancement layer 8n and the first current blocking layer 9 having a low carrier concentration. In this case, an undoped layer made of a material having a larger band gap than the first current blocking layer 9 having a low carrier concentration is preferably formed. In addition, the material for the undoped layer preferably has a band gap smaller than that of the p-type cladding layer 6 and larger than that of the first current blocking layer 9 having a low carrier concentration.

(12) Twelfth Embodiment

A semiconductor laser device according to a twelfth embodiment of the present invention is now described.

The structure of the semiconductor laser device according to the twelfth embodiment is similar to that shown in FIG. 23, except the materials, thicknesses and carrier concentrations of respective layers. Table 12 shows the materials, thicknesses and carrier concentrations of the respective layers of the semiconductor laser device according to this embodiment.

TABLE 12

| Name of Layer | | Composition and Name of Layer | Thickness (nm) | Carrier Concentration (cm$^{-3}$) | Numeral |
|---|---|---|---|---|---|
| | | n-GaN Substrate | | $1 \times 10^{18}$ | 1 |
| | | Cladding Layer of n-Al$_{0.15}$Ga$_{0.85}$N | 1000 | $3 \times 10^{17}$ | 2 |
| Emission Layer | Quantum Well Active Layer | Guide Layer of GaN | 30 | | 3 |
| | | Quantum Well Layer of In$_{0.15}$Ga$_{0.85}$N | 5 | | 15 |
| | | Barrier Layer of In$_{0.05}$Ga$_{0.95}$N | 5 | | 16 |
| | | Guide Layer of GaN | 30 | | 5 |
| | | Cladding Layer of p-Al$_{0.15}$Ga$_{0.85}$N | 1000 | $2 \times 10^{17}$ | 6 |
| | | Contact Layer of p-GaN | 200 | $3 \times 10^{17}$ | 7 |
| | | Depletion Enhancement Layer of n-GaN | t | $5 \times 10^{17}$ | 8n |
| | | First Current Blocking Layer Having a Low Carrier Concentration of GaN | 800 | | 9 |
| | | Second Current Blocking Layer of n-GaN | 200 | $5 \times 10^{17}$ | 10 |
| | | Contact Layer of p-GaN | 3000 | $8 \times 10^{17}$ | 11 |
| | | p-Electrode | 300 | | 12 |
| | | n-Electrode | 300 | | 13 |

As shown in Table 12, a n-type depletion enhancement layer 8n formed with n impurity levels (donor levels) of the opposite conduction type to a p-type cladding layer 6 is formed between the p-type cladding layer 6 and a first current blocking layer 9 having a low carrier concentration in the semiconductor laser device according to this embodiment. In this embodiment, therefore, carriers supplied from the donor levels formed on the n-type depletion enhancement layer 8n compensate for those supplied from the p-type cladding layer 6, similarly to the tenth embodiment. Therefore, the quantity of carriers stored in the first current blocking layer 9 having a low carrier concentration is reduced.

In this case, the band gap of the n-type depletion enhancement layer 8n and that of the first current blocking layer 9 having a low carrier concentration are equal to each other, and the band gaps of these layers 8n and 9 are smaller than that of the p-type cladding layer 6.

The first current blocking layer 9 having a low carrier concentration is kept in a depleted state due to reduction of the quantity of carriers stored therein, whereby electric capacitance generated between the first current blocking layer 9 having a low carrier concentration and the p-type cladding layer 6 can be reduced for sufficiently increasing the operating speed of the semiconductor laser device. In this embodiment, therefore, the high-frequency characteristic of the semiconductor laser device is improved.

In the semiconductor laser device according to this embodiment, the thickness t of the n-type depletion enhancement layer 8n having a carrier concentration of $5 \times 10^{17}$ cm$^{-3}$ is varied for measuring the cutoff frequency of the semiconductor laser device at each level of the thickness t. Consequently, it is proved that the cutoff frequency is remarkably improved when the thickness t of the n-type depletion enhancement layer 8n is 35 nm.

(13) Thirteenth Embodiment

Figure 28:
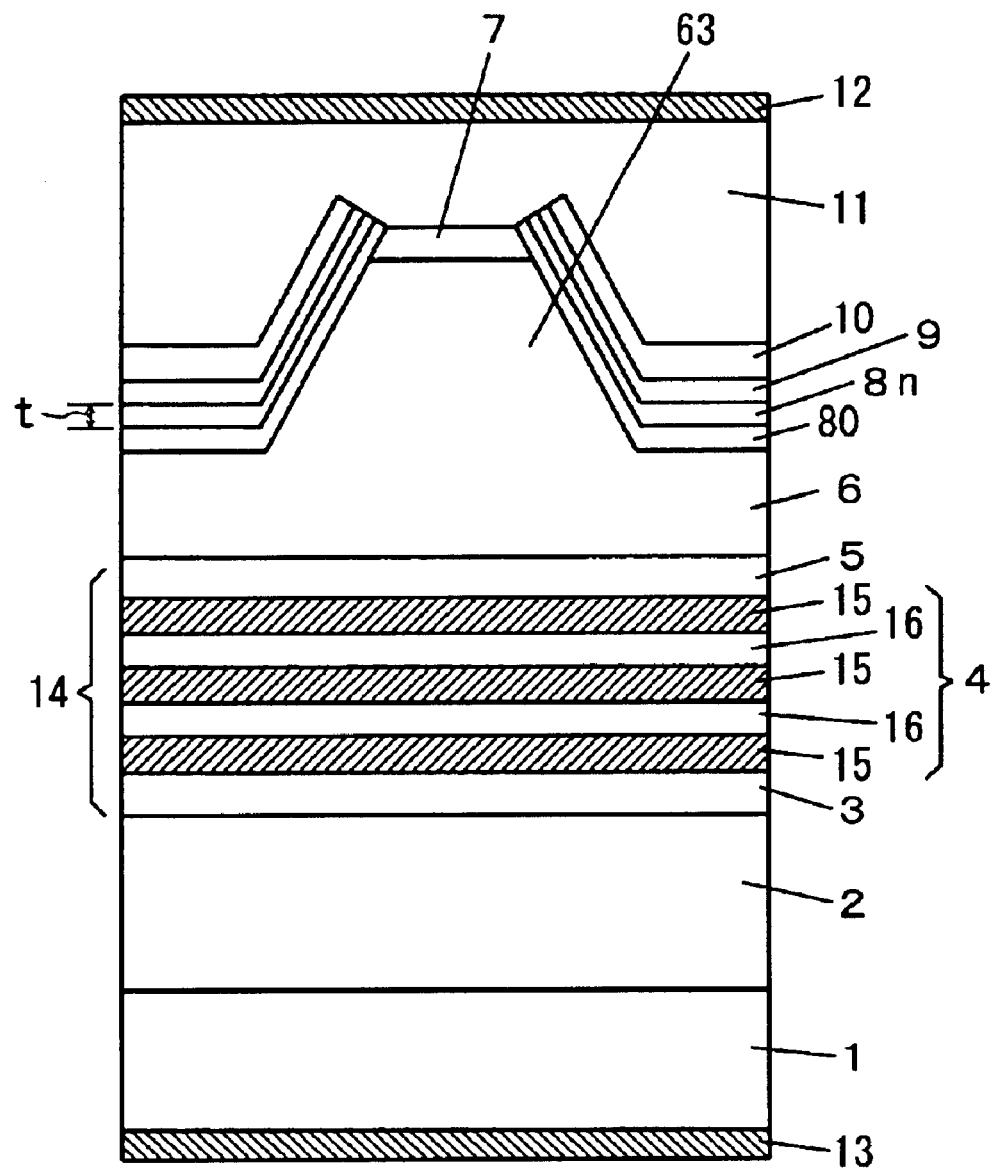
FIG. 28 is a typical sectional view of a semiconductor laser device according to a thirteenth embodiment of the present invention.

FIG. 28 is a typical sectional view showing a semiconductor laser device according to a thirteenth embodiment of the present invention.

The structure of the semiconductor laser device shown in FIG. 28 is similar to that of the semiconductor laser device shown in FIG. 23 except the following point:

In the semiconductor laser device shown in FIG. 28, an intermediate band gap layer 80 having a band gap smaller than that of a p-type cladding layer 6 and larger than that of a n-type depletion enhancement layer 8n is formed between the p-type cladding layer 6 and the n-type depletion enhancement layer 8n. Table 13 shows the structure of the semiconductor laser device shown in FIG. 28.

TABLE 13

| Name of Layer | | Composition and Name of Layer | Thickness (nm) | Carrier Concentration ($cm^{-3}$) | Numeral |
|---|---|---|---|---|---|
| | | n-GaAs Substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | | Guide Layer of $(Al_{0.5}Ga_{0.5})_{0.5}In_{0.5}P$ | 30 | | 3 |
| | Quantum Well Active Layer | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 1500 | $3 \times 10^{17}$ | 6 |
| | | Contact Layer of p-$Ga_{0.5}In_{0.5}P$ | 200 | $2 \times 10^{18}$ | 7 |
| | | Intermediate Bandgap Layer of $Ga_{0.5}In_{0.5}P$ | 20nn | | 80 |
| | | Depletion Enhancement Layer of n-GaAs | t | $5 \times 10^{17}$ | 8n |
| | | First Current Blocking Layer Having a Low Carrier Concentration of GaAs | 1000 | | 9 |
| | | Second Current Blocking Layer of n-GaAs | 500 | $8 \times 10^{17}$ | 10 |
| | | Contact Layer of p-GaAs | 3000 | $3 \times 10^{19}$ | 11 |
| | | p-Electrode | 300 | | 12 |
| | | n-Electrode | 300 | | 13 |

As shown in Table 13, the n-type depletion enhancement layer 8n formed with n impurity levels (donor levels) of the opposite conduction type to the p-type cladding layer 6 is formed between the p-type cladding layer 6 and a first current blocking layer 9 having a low carrier concentration in the semiconductor laser device according to this embodiment. In this embodiment, therefore, carriers supplied from the donor levels formed on the n-type depletion enhancement layer 8n compensate for those supplied from the p-type cladding layer 6, similarly to the tenth embodiment. Therefore, the quantity of carriers stored in the first current blocking layer 9 having a low carrier concentration is reduced.

The first current blocking layer 9 having a low carrier concentration is kept in a depleted state due to such reduction of the quantity of carriers stored therein, whereby electric capacitance generated between the first current blocking layer 9 having a low carrier concentration and the p-type cladding layer 6 can be reduced for sufficiently increasing the operating speed of the semiconductor laser device. Thus, the high-frequency characteristic of the semiconductor laser device is improved in the present invention.

In this embodiment, the band gap of the n-type depletion enhancement layer 8n and that of the first current blocking layer 9 having a low carrier concentration are equal to each other, and the band gaps of these layers 8n and 9 are smaller than that of the p-type cladding layer 6. Further, the intermediate band gap layer 80 having the intermediate band gap between the p-type cladding layer 6 and the n-type depletion enhancement layer 8n is formed between the p-type cladding layer 6 and the n-type depletion enhancement layer 8n. The embodiment having such an intermediate band gap layer 80 attains the following effect:

In this case, the band gaps of the p-type cladding layer 6, the intermediate band gap layer 8 and the n-type depletion enhancement layer 8n are reduced in this order, whereby the band offset between the p-type cladding layer 6 and the intermediate band gap layer 80 is smaller than that between the p-type cladding layer 6 and the n-type depletion enhancement layer 8n. Thus, carriers are hardly injected from the p-type cladding layer 6 into the intermediate band gap layer 80, and hardly injected into the n-type depletion enhancement layer 8n either. In this case, further, carriers are injected into both of the intermediate band gap layer 80 and the n-type depletion enhancement layer 8n in a divided manner, whereby the quantity of carriers injected into the n-type depletion enhancement layer 8n is reduced.

Thus, the quantities of carriers injected into the n-type depletion enhancement layer 8n as well as those injected into the first current blocking layer 9 having a low carrier concentration can be reduced by forming the intermediate band gap layer 80. Therefore, the quantity of carriers stored in the first current blocking layer 9 having a low carrier concentration can be further reduced.

In the semiconductor laser device according to this embodiment having the intermediate band gap layer 80, as hereinabove described, electric capacitance generated between the first current blocking layer 9 having a low carrier concentration and the p-type cladding layer 6 can be further reduced, thereby more improving the operating speed of the semiconductor laser device.

In the semiconductor laser device according to this embodiment, the thickness t of the n-type depletion enhancement layer 8n having a carrier concentration of $5 \times 10^{17}$ $cm^{-3}$ is varied for measuring the cutoff frequency of the semiconductor laser device at each level of the thickness t. Consequently, it is proved that the cutoff frequency is remarkably improved when the thickness t of the n-type depletion enhancement layer 8n is in the range of 15 to 35 nm.

Further, the thickness t of the n-type depletion enhancement layer 8n was set to 30 nm and the carrier concentration thereof is varied for measuring the cutoff frequency of the semiconductor laser device at each level of the carrier concentration. Consequently, it is proved that the cutoff frequency is remarkably improved when the carrier concentration of the n-type depletion enhancement layer 8n is in the range of $2.5 \times 10^{17}$ to $6 \times 10^{17}$ $cm^{-3}$.

As understood from the aforementioned results, the ranges of the thickness t and the carrier concentration of the n-type depletion enhancement layer 8n capable of remarkably improving the cutoff frequency of the semiconductor laser device are widened in the embodiment provided with the intermediate band gap layer 80 as compared with the first embodiment having no intermediate band gap layer. Therefore, the thickness t and the carrier concentration of the n-type depletion enhancement layer 8n can be readily set and the n-type depletion enhancement layer 8n can be readily prepared.

(14) Fourteenth Embodiment

Figure 29:
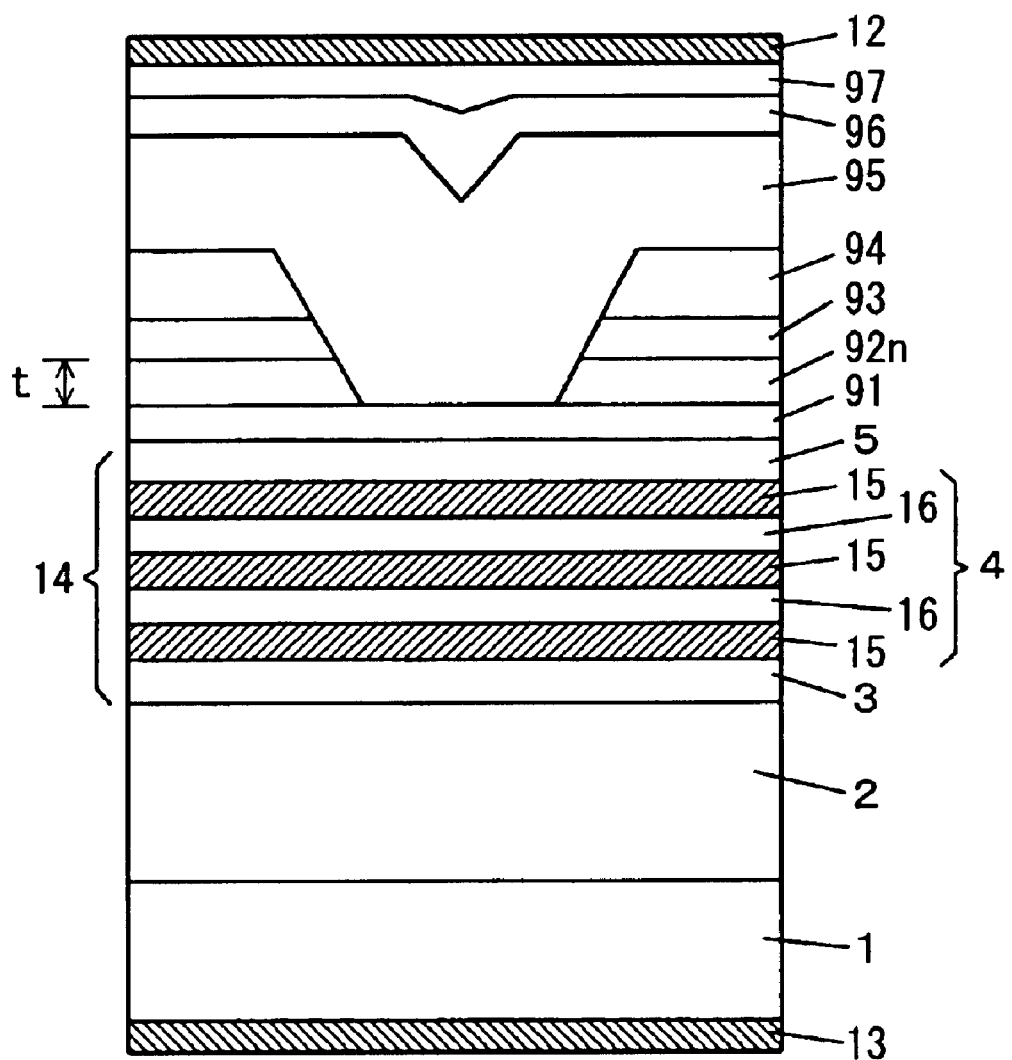
FIG. 29 is a typical sectional view of a semiconductor laser device according to a fourteenth embodiment of the present invention.

FIG. 29 is a typical sectional view of a semiconductor laser device according to a fourteenth embodiment of the present invention.

In the semiconductor laser device shown in FIG. 29, respective layers 2 to 5 are formed on an n-GaAs substrate 1, similarly to the semiconductor laser device shown in FIG. 23.

A cladding layer 91 of p-$(Al_{0.7}Ga_{0.3})_{0.5}In_{0.5}P$ having a thickness of 200 nm is formed on the guide layer 5. The carrier concentration of the p-type cladding layer 91 is $3 \times 10^{17}$ cm$^{-3}$.

A depletion enhancement layer 92n of n-$Ga_{0.5}In_{0.5}P$, a first current blocking layer 93 of undoped GaAs of a low carrier concentration having a thickness of 1000 nm and a second current blocking layer 94 of n-GaAs having a thickness of 500 nm are successively formed on the p-type cladding layer 91.

Central regions of the n-type depletion enhancement layer 92n, the first current blocking layer 93 having a low carrier concentration layer and the second current blocking layer 94 are removed to define a striped opening. The carrier concentration of the n-type depletion enhancement layer 92n is $5 \times 10^{17}$ cm$^{-3}$. The carrier concentration of the second current blocking layer 94 is $8 \times 10^{17}$ cm$^{-3}$.

A cladding layer 95 of p-$(Al_{0.7}Ga_{0.3})_{0.5}In_{0.5}P$ having a thickness of 1300 nm is formed on the p-type cladding layer 91 and the second current blocking layer 94 to fill up the striped opening. The carrier concentration of the p-type cladding layer 95 is $3 \times 10^{17}$ cm$^{-3}$. Thus, the semiconductor device shown in FIG. 29 has a self-aligned structure.

A contact layer 96 of p-$Ga_{0.5}In_{0.5}P$ having a thickness of 200 nm is formed on the p-type cladding layer 95. A contact layer 97 of p-GaAs having a thickness of 3000 nm is formed on the p-type contact layer 96. The carrier concentration of the p-type contact layer 96 is $2 \times 10^{18}$ cm$^{-3}$. The carrier concentration of the p-type contact layer 97 is $3 \times 10^{19}$ cm$^{-3}$.

Table 14 shows the aforementioned structure.

TABLE 14

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-$(Al_{0.7}Ga_{0.3})_{0.5}In_{0.5}P$ | 1500 | $3 \times 10^{17}$ | 2 |
| Emission Layer | | Guide Layer of $(Al_{0.5}Ga_{0.5})_{0.5}In_{0.5}P$ | 30 | | 3 |
| | Quantum Well Active Layer | Quantum Well Layer of $Ga_{0.5}In_{0.5}P$ | 5 | | 15 |
| | | Barrier Layer of $(Al_{0.5}Ga_{0.5})_{0.5}In_{0.5}P$ | 5 | | 16 |
| | | Guide Layer of $(Al_{0.5}Ga_{0.5})_{0.5}In_{0.5}P$ | 30 | | 5 |
| | | Cladding Layer of p-$(Al_{0.7}Ga_{0.3})_{0.5}In_{0.5}P$ | 200 | $3 \times 10^{17}$ | 91 |

TABLE 14-continued

| Name of Layer | Composition and Name of Layer | Thickness (nm) | Carrier Concentration (cm$^{-3}$) | Numeral |
|---|---|---|---|---|
| | Cladding Layer of p-$(Al_{0.7}Ga_{0.3})_{0.5}In_{0.5}P$ | 1300 | $3 \times 10^{17}$ | 95 |
| | Depletion Enhancement layer of n-$Ga_{0.5}In_{0.5}P$ | t | $5 \times 10^{17}$ | 92n |
| | First Current Blocking Layer Having a Low Carrier Concentration of GaAs | 1000 | | 93 |
| | Second Current Blocking Layer of n-GaAs | 500 | $8 \times 10^{17}$ | 94 |
| | Contact Layer of p-$Ga_{0.5}In_{0.5}P$ | 200 | $2 \times 10^{18}$ | 96 |
| | Contact Layer of p-GaAs | 3000 | $3 \times 10^{19}$ | 97 |
| | p-Electrode | 300 | | 12 |
| | n-Electrode | 300 | | 13 |

Figure 30:
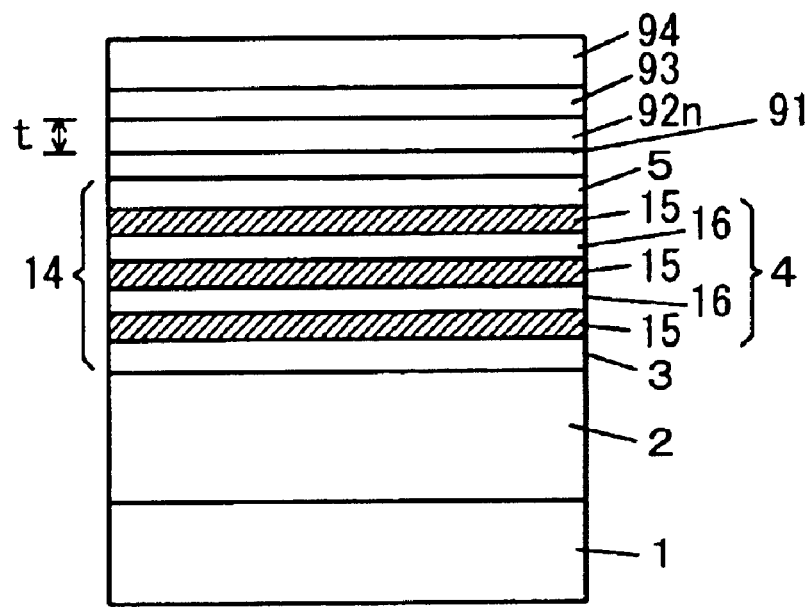
FIGS. 30 and 31 are typical sectional views showing steps in a method of fabricating the semiconductor laser device shown in FIG. 29.
Figure 31:
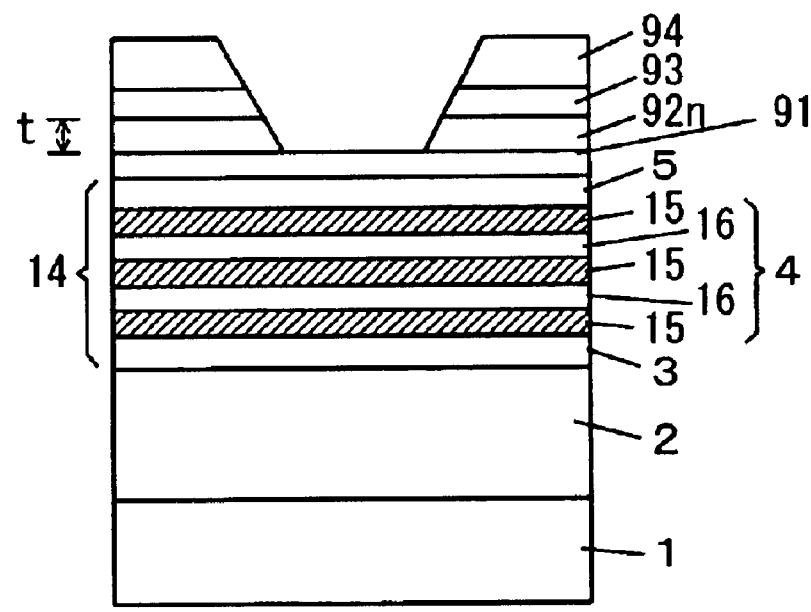

FIGS. 30 and 31 are typical sectional views showing steps in a method of fabricating the semiconductor laser device shown in FIG. 29.

As shown in FIG. 30, the cladding layer 2 of n-$(Al_{0.7}Ga_{0.3})_{0.5}In_{0.5}P$, the guide layer 3 of $(Al_{0.5}Ga_{0.5})_{0.5}In_{0.5}P$ having a thickness of 30 nm, the quantum well active layer 4, the guide layer of $(Al_{0.5}Ga_{0.5})_{0.5}In_{0.5}P$ having a thickness of 30 nm, the cladding layer 91 of p-$(Al_{0.7}Ga_{0.3})_{0.5}In_{0.5}P$, the depletion enhancement layer 92n of n-$Ga_{0.5}In_{0.5}P$, the first current blocking layer 93 of undoped GaAs having a low carrier concentration and the second current blocking layer 94 of n-GaAs are successively grown on the n-GaAs substrate 1 by MOCVD.

A mask (not shown) is formed on the second current blocking layer 94 and patterned to have a striped opening. Thereafter the central portions of the second current blocking layer 94, the first current blocking layer 93 having a low carrier concentration and the depletion enhancement layer 92n are removed by etching for forming the striped opening, as shown in FIG. 31.

Then, the cladding layer 95 of p-$(Al_{0.7}Ga_{0.3})_{0.5}In_{0.5}P$, the contact layer 96 of p-$Ga_{0.5}In_{0.5}P$ and the contact layer 97 of p-GaAs are successively formed on the second current blocking layer 94 and on the p-type cladding layer 91 located in the striped opening by MOCVD, as shown in FIG. 29. A p-electrode 12 of Cr/Au is formed on the surface of the p-type contact layer 97, and an n electrode 13 of AuGe/Ni/Au is formed on the back side of the n-GaAs substrate 1.

In the semiconductor laser device shown in FIG. 31, the n-type depletion enhancement layer 92n formed with impurity levels (donor levels) of the opposite conduction type to the p-type cladding layer 91 is formed between the p-type cladding layer 91 and the first current blocking layer 93 having a low carrier concentration. In this embodiment, therefore, carriers supplied from the donor levels formed on the n-type depletion enhancement layer 92n compensate for those supplied from the p-type cladding layer 91, similarly to the tenth embodiment. Therefore, the quantity of carriers stored in the first current blocking layer 93 having a low carrier concentration is reduced.

The first current blocking layer 93 having a low carrier concentration is kept in a depleted state due to such reduction of the quantity of carriers stored therein, whereby electric capacitance generated between the first current blocking layer 93 having a low carrier concentration and the p-type cladding layer 91 can be reduced for sufficiently increasing the operating speed of the semiconductor laser device. Thus, the high-frequency characteristic of the semiconductor laser device is improved in this embodiment.

In the semiconductor laser device shown in FIG. 29, the thickness t of the n-type depletion enhancement layer 92n having a carrier concentration of $5 \times 10^{17}$ cm$^{-3}$ is varied for measuring the cutoff frequency of the semiconductor laser device at each level of the thickness t. Consequently, it is proved that the cutoff frequency is remarkably improved when the thickness t of the n-type depletion enhancement layer 92n is in the range of 20 to 35 nm.

Further, the thickness t of the n-type depletion enhancement layer 92n is set to 30 nm and the carrier concentration thereof is varied for measuring the cutoff frequency of the semiconductor laser device at each level of the carrier concentration. Consequently, it is proved that the cutoff frequency is remarkably improved when the carrier concentration of the n-type depletion enhancement layer 92n is in the range of $3 \times 10^{17}$ to $6 \times 10^{17}$ cm$^{-3}$.

(15) Fifteenth Embodiment

A semiconductor laser device according to a fifteenth embodiment of the present invention is now described.

The structure of the semiconductor laser device according to the fifteenth embodiment is similar to that shown in FIG. 29, except the materials, thicknesses and carrier concentrations of respective layers. Table 15 shows the materials, thicknesses and carrier concentrations of the respective layers of the semiconductor laser device according to this embodiment.

TABLE 15

| Name of Layer | | Composition and Name of Layer | Thickness (nm) | Carrier Concentration (cm$^{-3}$) | Numeral |
|---|---|---|---|---|---|
| | | n-GaAs Substrate | | $1 \times 10^{18}$ | 1 |
| | | Cladding Layer of n-Al$_{0.45}$Ga$_{0.55}$As | 1500 | $3 \times 10^{17}$ | 2 |
| Emission Layer | | Guide Layer of Al$_{0.35}$Ga$_{0.65}$As | 30 | | 3 |
| | Quantum Well Active Layer | Quantum Well Layer of Al$_{0.1}$Ga$_{0.9}$As | 5 | | 15 |
| | | Barrier Layer of Al$_{0.35}$Ga$_{0.65}$As | 5 | | 16 |
| | | Guide Layer of Al$_{0.35}$Ga$_{0.65}$As | 30 | | 5 |
| | | Cladding Layer of p-Al$_{0.45}$Ga$_{0.55}$As | 200 | $1 \times 10^{18}$ | 91 |
| | | Cladding Layer of p-Al$_{0.45}$Ga$_{0.55}$As | 1300 | $1 \times 10^{18}$ | 95 |
| | | Depletion Enhancement Layer of n-GaAs | t | $5 \times 10^{17}$ | 92n |
| | | First Current Blocking Layer Having a Low Carrier Concentration of GaAs | 1000 | | 93 |
| | | Second Current Blocking Layer of n-GaAs | 500 | $5 \times 10^{17}$ | 94 |
| | | Contact Layer of p-GaAs | 200 | $4 \times 10^{18}$ | 96 |
| | | Contact Layer of p-GaAs | 3000 | $3 \times 10^{19}$ | 97 |

TABLE 15-continued

| Name of Layer | Composition and Name of Layer | Thickness (nm) | Carrier Concentration (cm$^{-3}$) | Numeral |
|---|---|---|---|---|
| | p-Electrode | 300 | | 12 |
| | n-Electrode | 300 | | 13 |

As shown in Table 15, a n-type depletion enhancement layer 92n formed with impurity levels (donor levels) of the opposite conduction type to a p-type cladding layer 91 is formed between the p-type cladding layer 91 and a first current blocking layer 93 having a low carrier concentration in the semiconductor laser device according to this embodiment. In this embodiment, therefore, carriers supplied from the donor levels formed on the n-type depletion enhancement layer 92n compensate for those supplied from the p-type cladding layer 91, similarly to the tenth embodiment. Therefore, the quantity of carriers stored in the first current blocking layer 93 having a low carrier concentration is reduced.

The first current blocking layer 93 having a low carrier concentration is kept in a depleted state due to such reduction of the quantity of carriers stored therein, whereby electric capacitance generated between the first current blocking layer 93 having a low carrier concentration and the p-type cladding layer 91 can be reduced for sufficiently increasing the operating speed of the semiconductor laser device. Thus, the high-frequency characteristic of the semiconductor laser device is improved in this embodiment.

Figure 32:
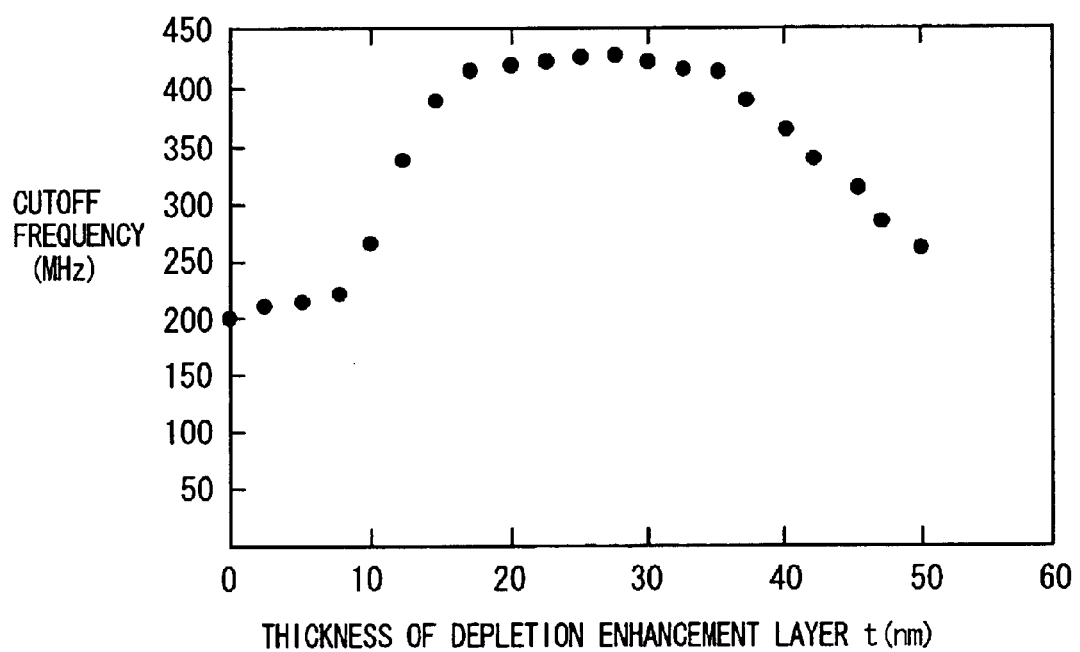
FIG. 32 is a diagram showing results of measurement of the relation between a cutoff frequency and the thickness of a depletion enhancement layer in the semiconductor laser device according to the fourteenth embodiment.

FIG. 32 is a diagram showing the results of measurement of a cutoff frequency of the semiconductor laser device shown in Table 15 with variation of the thickness t of the n-type depletion enhancement layer 92n. In this case, the carrier concentration of the n-type depletion enhancement layer 92n is $5 \times 10^{17}$ cm$^{-3}$.

The cutoff frequency, 200 MHz when the semiconductor laser device is formed with no n-type depletion enhancement layer 92n, is gradually improved when the thickness of the n-type depletion enhancement layer 92n is increased, and remarkably improved when the thickness t of the n-type depletion enhancement layer 92n is in the range of 15 to 35 nm, as shown in FIG. 32.

The thickness t of the n-type depletion enhancement layer 92n is set to 25 nm and the carrier concentration thereof is varied for measuring the cutoff frequency of the semiconductor laser device at each level of the carrier concentration. Consequently, it is proved that the cutoff frequency is remarkably improved when the carrier concentration of the n-type depletion enhancement layer 92n is in the range of $3.5 \times 10^{17}$ to $8 \times 10^{17}$ cm$^{-3}$.

(16) Sixteenth Embodiment

A semiconductor laser device according to a sixteenth embodiment of the present invention is now described.

The structure of the semiconductor laser device according to the sixteenth embodiment is similar to that shown in FIG. 29, except the materials, thicknesses and carrier concentrations of respective layers. Table 16 shows the materials, thicknesses and carrier concentrations of the respective layers of the semiconductor laser device according to this embodiment.

TABLE 16

| Name of Layer | | Composition and Name of Layer | Thickness (nm) | Carrier Concentration (cm$^{-3}$) | Numeral |
|---|---|---|---|---|---|
| | | n-GaN Substrate | | $1 \times 10^{18}$ | 1 |
| | | Cladding Layer of n-Al$_{0.15}$Ga$_{0.85}$N | 1000 | $3 \times 10^{17}$ | 2 |
| Emission Layer | | Guide Layer of GaN | 30 | | 3 |
| | Quantum Well Active Layer | Quantum Well Layer of In$_{0.15}$Ga$_{0.85}$N | 5 | | 15 |
| | | Barrier layer of In$_{0.05}$Ga$_{0.95}$N | 5 | | 16 |
| | | Guide Layer of Ga$_N$ | 30 | | 5 |
| | | Cladding Layer of p-Al$_{0.15}$Ga$_{0.85}$N | 100 | $2 \times 10^{17}$ | 91 |
| | | Cladding Layer of p-Al$_{0.15}$Ga$_{0.85}$N | 900 | $2 \times 10^{17}$ | 95 |
| | | Depletion Enhancement Layer of n-Al$_{0.07}$Ga$_{0.93}$N | t | $5 \times 10^{17}$ | 92n |
| | | First Current Blocking Layer Having a Low Carrier Concentration of GaN | 800 | | 93 |
| | | Second Current Blocking Layer of n-GaN | 200 | $5 \times 10^{17}$ | 94 |
| | | First Contact Layer of p-GaN | 200 | $3 \times 10^{17}$ | 96 |
| | | Second Contact Layer of p-GaN | 3000 | $8 \times 10^{17}$ | 97 |
| | | p-Electrode | 300 | | 12 |
| | | n-Electrode | 300 | | 13 |

As shown in Table 16, a n-type depletion enhancement layer 92n formed with impurity levels (donor levels) of the opposite conduction type to a p-type cladding layer 91 is formed between the p-type cladding layer 91 and a first current blocking layer 93 having a low carrier concentration in the semiconductor laser device according to this embodiment. In this embodiment, therefore, carriers supplied from the donor levels formed in the n-type depletion enhancement layer 92n compensate for those supplied from the p-type cladding layer 91, similarly to the tenth embodiment. Therefore, the quantity of carriers stored in the first current blocking layer 93 having a low carrier concentration is reduced.

The first current blocking layer 93 having a low carrier concentration is kept in a depleted state due to such reduction of the quantity of carriers stored therein, whereby electric capacitance generated between the first current blocking layer 93 having a low carrier concentration and the p-type cladding layer 91 can be reduced for sufficiently increasing the operating speed of the semiconductor laser device. Thus, the high-frequency characteristic of the semiconductor laser device is improved in this embodiment.

According to this embodiment, the semiconductor laser device is so set that the band gap of the n-type depletion enhancement layer 92n is smaller than that of the p-type cladding layer 91 and larger than that of the first current blocking layer 93 having a low carrier concentration. The n-type depletion enhancement layer 92n according to this embodiment also has the function as the intermediate band gap layer 80 in the thirteenth embodiment.

In this case, the band gaps of the p-type cladding layer 91, the n-type depletion enhancement layer 92n and the first current blocking layer 93 having a low carrier concentration are reduced in this order. Therefore, the band offset between the p-type cladding layer 91 and the n-type depletion enhancement layer 92n is smaller than that between the p-type cladding layer 91 and the first current blocking layer 93 having a low carrier concentration. Thus, carriers are hardly injected from the p-type cladding layer 91 into the n-type depletion enhancement layer 92n, and hardly injected into the first current blocking layer 93 having a low carrier concentration either. In this case, further, carriers are injected into both of the n-type depletion enhancement layer 92n and the first current blocking layer 93 having a low carrier concentration in a divided manner, whereby the quantity of carriers injected into the first current blocking layer 93 having a low carrier concentration is reduced.

As hereinabove described, the quantity of carriers stored in the first current blocking layer 93 having a low carrier concentration can be further reduced by forming the n-type depletion enhancement layer 92n also serving as the intermediate band gap layer.

Thus, electric capacitance generated between the first current blocking layer 93 having a low carrier concentration and the p-type cladding layer 91 can be further reduced in the embodiment having the n-type depletion enhancement layer 92n also serving as the intermediate band gap layer, whereby the operating speed of the semiconductor laser device is further improved.

In the semiconductor laser device according to this embodiment, the thickness t of the n-type depletion enhancement layer 92n having a carrier concentration of $5 \times 10^{17}$ cm$^{-3}$ is varied for measuring the cutoff frequency of the semiconductor laser device at each level of the thickness t. Consequently, it is proved that the cutoff frequency is remarkably improved when the thickness t of the n-type depletion enhancement layer 92n is 40 nm.

In the semiconductor laser device according to this embodiment, an undoped layer may be formed between the n-type depletion enhancement layer 92n and the p-type cladding layer 91. Alternatively, an undoped layer may be formed between the n-type depletion enhancement layer 92n and the first current blocking layer 93 having a low carrier concentration. In this case, an undoped layer made of a material having a larger band gap than the first current blocking layer 93 having a low carrier concentration is preferably formed. In addition, the material for the undoped layer preferably has a band gap smaller than that of the p-type cladding layer 91 and larger than that of the first current blocking layer 93 having a low carrier concentration.

In each of the aforementioned tenth to sixteenth embodiments, the donor levels are formed on the depletion enhancement layer by doping the same with an n-type impurity. In this case, the donor levels formed on the depletion enhancement layer are preferably set to such density that most of the donor levels ionize in a state applying no bias voltage voltage.

While the n-type depletion enhancement layer of the opposite conduction type is formed on the region of the p-type cladding layer excluding the current injection region in each of the aforementioned tenth to sixteenth embodiments, the n-type depletion enhancement layer may alternatively be formed on the current injection region of the p-type cladding layer. In this case, however, the thickness of the n-type depletion enhancement layer is reduced not to inhibit the current injection.

While the reverse conduction type second current blocking layer is provided on the first current blocking layer having a low carrier concentration in each of the aforementioned tenth to sixteenth embodiments, the reverse conduction type second current blocking layer is not necessarily required in the present invention but only the first current blocking layer having a low carrier concentration may be formed as the current blocking layer.

While the semiconductor laser device is prepared from a group III nitride semiconductor, an AlGaInP based semiconductor or an AlGaAs based semiconductor in each of the aforementioned tenth to sixteenth embodiments, the present invention is also applicable to other group III–V, group II–VI, group IV and group IV—IV semiconductors such as GaInAs. The present invention is particularly effective for a semiconductor laser device employing a semiconductor such as a group III nitride semiconductor, an AlGaInP based semiconductor or an AlGaAs based semiconductor, for example, hardly allowing formation of a semi-insulating semiconductor during epitaxy.

The principle and the function of the present invention are now described in detail.

It is assumed that e represents elementary electric charge, $\epsilon_c$ represents the dielectric constant of a cladding layer, $\epsilon$ represents the dielectric constant of a depletion enhancement layer, $N_c$ represents the carrier concentration of the cladding layer, N represents the carrier concentration of the depletion enhancement layer, $E_{gc}$ represents the band gap of the cladding layer, $\Delta E_v$ represents the valence band discontinuity at interface of the cladding layer and the depletion enhancement layer, and $\Delta E_c$ represents the quantity of conduction band discontinuity between the cladding layer and the depletion enhancement layer.

Figure 33:
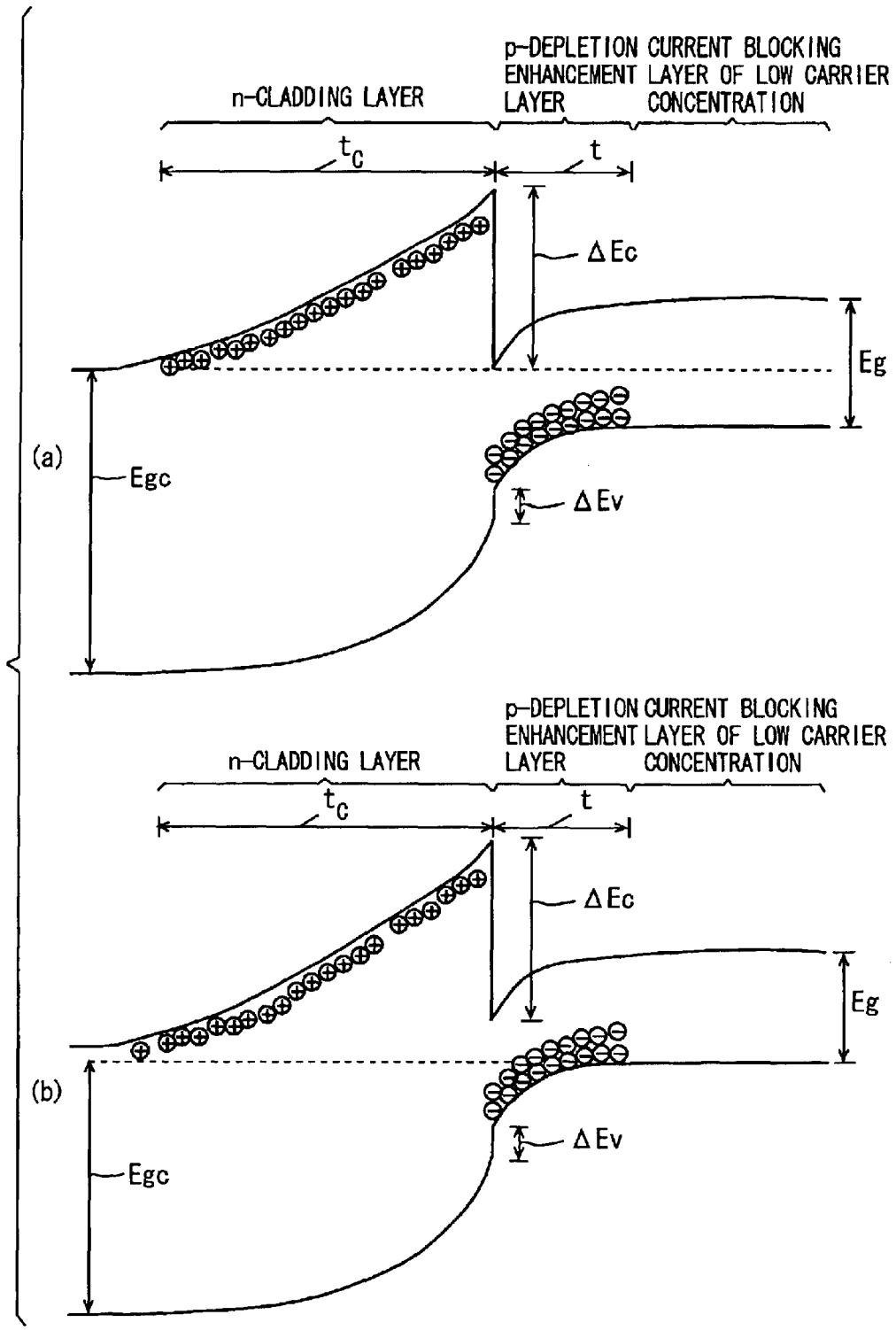
FIGS. 33(a) and 33(b) are diagrams for illustrating the principle and the function of the present invention.
Figure 34:
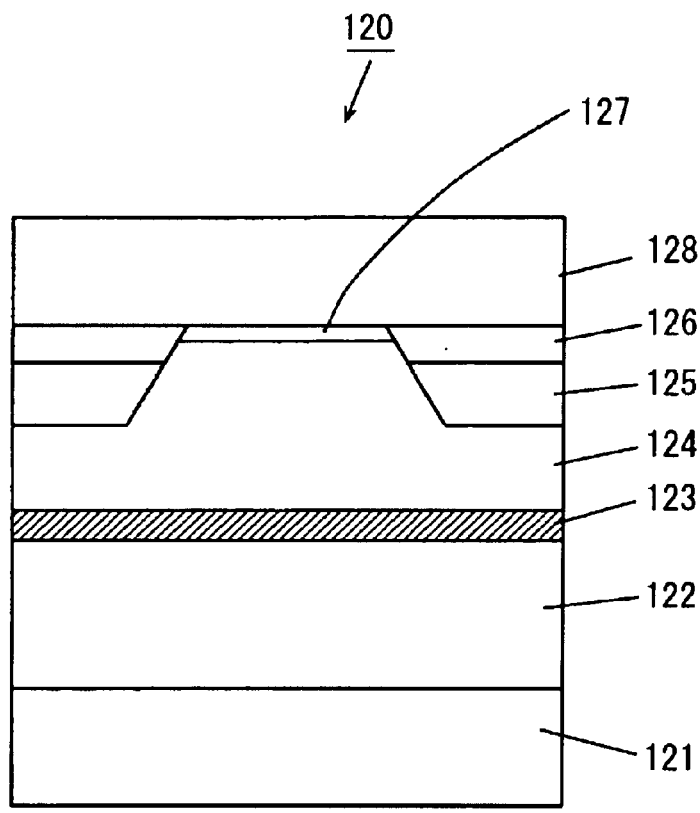
FIG. 34 is a typical sectional view showing the structure of a conventional semiconductor laser device.
Figure 35:
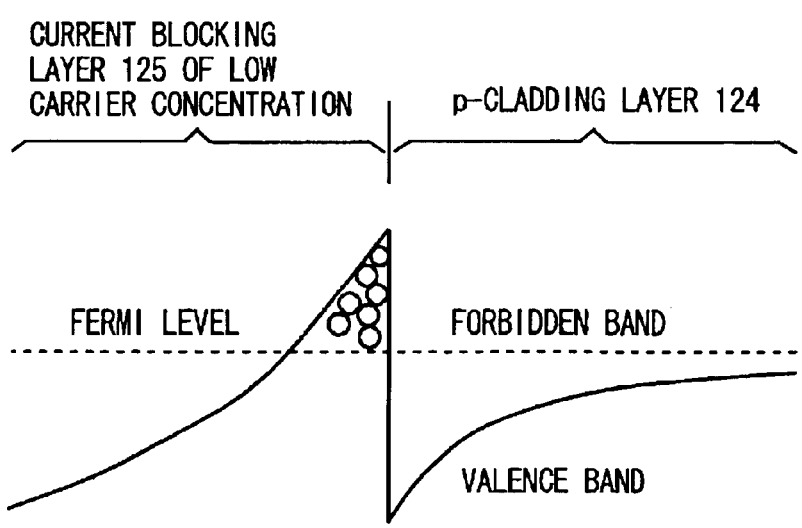
FIG. 35 is an energy band diagram of valence bands of a p-type cladding layer and a current blocking layer having a low carrier concentration in the semiconductor laser device shown in FIG. 34.

Consider that the cladding layer is of the n type and acceptor levels are formed on the depletion enhancement layer, as shown in FIGS. 33(a) and 33(b).

Also consider that relation $\epsilon_c N_c \Delta E_c/(\epsilon N) < \epsilon_{gc} - \Delta E_c - \Delta E_v$ holds while satisfying the following condition (1) or (2):

(1) The cladding layer and the depletion enhancement layer have no distortion.

(2) Each layer is made of a semiconductor having a zinc-blend structure and the stacking direction of each layer is expressed in the direction of a general formula [0MN] (M and N represent arbitrary numbers excluding M=N=0, e.g., the [001] direction and the [011] direction) or each layer is made of a semiconductor having a wurtzite structure and the stacking direction of each layer is expressed in the direction of a general formula [HKL0] direction (H, K and L represent arbitrary numbers satisfying H+K+L=0 excluding H=K=L=0, e.g., the [1100] direction and the [1120] direction).

FIG. 33(a) shows the band structures of the cladding layer and the depletion enhancement layer in the case where the thickness t of the depletion enhancement layer is about $t_A = [2\epsilon_c N_c \Delta E_c]^{1/2}/(eN)$.

As shown in FIG. 33(a), the energy of the lowest portion (the interface between the depletion enhancement layer and the cladding layer) of the conduction band of the depletion enhancement layer is equal to that of the lowest portion of the conduction band of the cladding layer. Therefore, no carriers are stored on the interface between the conduction band of the depletion enhancement layer and that of the cladding layer.

FIG. 33(b) shows the band structures of the cladding layer and the depletion enhancement layer in the case where the thickness t of the depletion enhancement layer is about $t_B = [2\epsilon_c \epsilon N_c (E_{gc} - \Delta E_v)/[N(\epsilon_c N_c + \epsilon N)]]^{1/2}/e$.

As shown in FIG. 33(b), the energy of the highest portion (the interface between the depletion enhancement layer and a first current blocking layer having a low carrier concentration) of the valence band of the depletion enhancement layer is equal to that of the lowest portion of the conduction band of the cladding layer. Therefore, all acceptor levels of the depletion enhancement layer ionize to supply no carriers the current blocking layer having a low carrier concentration.

When the thickness t of the depletion enhancement layer is in the range of $t_A \leq t \leq t_B$, the quantity of charges stored on the interface between the cladding layer and the depletion enhancement layer remains unchanged with respect to small change of an electric field applied to the interface. In other words, transient electric capacitance can be approximated to zero on the interface between the cladding layer and the depletion enhancement layer. Thus, the thickness t of the depletion enhancement layer is preferably set in the aforementioned range in particular.

When $\epsilon_c N_c \Delta E_c/(\epsilon N) = E_{gc} - \Delta E_v$, $t_A = t_B$. Therefore, it is difficult to set $t = t_A = t_B$ by adjusting the thickness t and the carrier concentration N of the depletion enhancement layer. In other words, the thickness t and the carrier concentration N of the depletion enhancement layer can be more readily set as the value of $E_{gc} - \Delta E_c - \Delta E_v$ is increased beyond the value of $\epsilon_c N_c \Delta E_c/(\epsilon N)$.

In a general combination of materials for a cladding layer and a depletion enhancement layer employed for a semiconductor laser device, $\epsilon_c$ is substantially equal to $\epsilon$, and $\Delta E_c$ is less than the band gap $(E_{gc} - \Delta E_c - \Delta E_v)$ of the depletion enhancement layer. While $\epsilon_c N_c \Delta E_c/(\epsilon N)$ may be greater than $E_{gc} - \Delta E_v - \Delta E_c$ when $N_c \gg N$, the relation $\epsilon_c N_c \Delta E_c/(\epsilon N) < E_{gc} - \Delta E_c - \Delta E_v$ can be readily satisfied when $N \gg N_c$ or N is substantially equal to $N_c$.

While the case were the cladding layer is of the n type and the acceptor levels are formed on the depletion enhancement layer has been considered in the above discussion, a similar effect is attained also when the cladding layer is of the p type and the depletion enhancement layer is formed with donor levels as in the aforementioned embodiments.

When the relation $\epsilon_c N_c \Delta E_c/(\epsilon N) < E_{gc} - \Delta E_c - \Delta E_v$ holds in the p-type cladding layer and the depletion enhancement layer formed with donor levels, the quantity of charges stored in the interface between the cladding layer and the depletion enhancement layer remains unchanged with respect to small change of an electric field applied to the interface if the thickness t is in the range of $t_A \leq t \leq t_B$. In other words, transient electric capacitance can be approximated to zero in the interface between the cladding layer and the depletion enhancement layer. Therefore, the thickness t of the depletion enhancement layer formed with the donor levels is preferably set in the aforementioned range in particular. Further, the carrier concentration $N_c$ of the p-type cladding layer and the carrier concentration N of the depletion enhancement layer formed with the donor levels further preferably satisfy $N_c \leq N$.

When forming an intermediate band gap layer between the cladding layer and the depletion enhancement layer as in the thirteenth embodiment, conditions on the $t_A$ side are widened. When the depletion enhancement layer has the function of the intermediate band gap layer as in the eleventh and sixteenth embodiments, conditions on the $t_A$ and $t_B$ sides are widened. This appears in the range of the optimum thickness of the depletion enhancement layer 8n described above with reference to each of the eleventh, thirteenth and sixteenth embodiments.

Neither of the conditions (1) and (2) applies to the semiconductor laser device according to each of the twelfth and sixteenth embodiments but a potential gradient resulting from a piezoelectric field is caused in the cladding layer due to distortion. Therefore, the aforementioned relations cannot be readily guided in these embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:
an active layer;
a first cladding layer of a first conduction type provided on said active layer;
a current blocking layer of a second conduction type provided on said first cladding layer except a current injection region;
a low carrier concentration layer provided on the side of said current blocking layer between said first cladding layer and said current blocking layer and having a lower carrier concentration than said current blocking layer; and
a depletion enhancement layer provided on the side of said first cladding layer between said first cladding layer and said current blocking layer for inhibiting storage of camera in said low carrier concentration layer,
the thickness of the depletion enhancement layer is at least 10 nm.

2. The semiconductor laser device according to claim 1, wherein
the band gap of said first cladding layer is larger than that of said depletion enhancement layer, and the band gap of said depletion enhancement layer is larger than that of said low carrier concentration layer.

3. The semiconductor laser device according to claim 1, wherein
said first cladding layer has a flat portion formed on said active layer and a ridge portion formed on a portion of said flat portion in said current injection region,
said depletion enhancement layer is provided on said flat portion located on both sides of said ridge portion and on the side surfaces of said ridge portion, and
said low carrier concentration layer and said current blocking layer are successively formed on said depletion enhancement layer.

4. The semiconductor laser device according to claim 3, wherein
the thickness of said depletion enhancement layer is at least 15 nm.

5. The semiconductor laser device according to claim 1, further comprising a ridge-shaped second cladding layer of a first conduction type provided on said depletion enhancement layer in said current injection region, wherein
said depletion enhancement layer is formed on said first cladding layer, and
said low carrier concentration layer and said current blocking layer are successively formed on said depletion enhancement layer located on both sides of said second cladding layer and on the side surfaces of said second cladding layer.

6. A semiconductor laser device comprising:
an active layer;
a first cladding layer of a first conduction type provided on said active layer;
a current blocking layer of a second conduction type provided on said first cladding layer except a current injection region;
a low carrier concentration layer provided on the side of said current blocking layer between said first cladding layer and said current blocking layer and having a lower carrier concentration than said current blocking layer; and
a depletion enhancement layer provided on the side of said first cladding layer between said first cladding layer and said current blocking layer for inhibiting storage of carriers in said low carrier concentration layer, wherein
said depletion enhancement layer, said low carrier concentration layer and said current blocking layer are successively formed on said first cladding layer except said current injection region,
said semiconductor laser device further comprising a second cladding layer of a first conduction type provided to fill up a space enclosed with the side surfaces of said depletion enhancement layer, said low carrier concentration layer and said current blocking layer and the upper surface of said first cladding layer in said current injection region.

7. The semiconductor laser device according to claim 5, wherein
the thickness of said depletion enhancement layer is at least 15 nm.

8. The semiconductor laser device according to claim 7, wherein
the thickness of said depletion enhancement layer is at least 20 nm.

9. The semiconductor laser device according to claim 6, wherein
the thickness of said depletion enhancement layer is at least 15 nm.

10. The semiconductor laser device according to claim 9, wherein
the thickness of said depletion enhancement layer is at least 20 nm.

11. The semiconductor laser device according to claim 1, wherein
said depletion enhancement layer has a single-layer structure or a superlattice structure.

12. The semiconductor laser device according to claim 1, wherein
said active layer includes a layer made of $(Al_{x1}Ga_{1-x1})_{y1}In_{1-y1}P$,
said depletion enhancement layer is made of $(Al_{x2}Ga_{1-x2})_{y1}In_{1-y2}P$ or $Al_{x2}Ga_{1-x2}As$,
said low carrier, concentration layer is made of $(Al_{x3}Ga_{1-x3})_{y3}In_{1-y3}P$ or $Al_{x3}Ga_{1-x3}As$,
said current blocking layer is made of $(Al_{x4}Ga_{1-x4})_{y4}In_{1-y4}P$ or $Al_{x4}Ga_{1-x4}As$, and
said x1, said x2, said x3, said x4, said y1, said y2, said y3 and said y4 are at least zero and not more than 1 respectively.

13. The semiconductor laser device according to claim 1, wherein
said active layer includes a layer made of $Al_{x1}Ga_{1-x1}As$,
said depletion enhancement layer is made of $Al_{x2}Ga_{1-x2}As$,
said low carrier concentration layer is made of $Al_{x3}Ga_{1-x3}As$, said current blocking layer is made of $Al_{x4}Ga_{1-x4}As$, and said x1, said x2, said x3 and said x4 are at least zero and not more than 1 respectively.

14. The semiconductor laser device according to claim 1, wherein said active layer is made of $In_{x1}Ga_{1-x1}N$, said depletion enhancement layer is made of $Al_{x1}Ga_{1-x2}N$, said low carrier concentration layer is made of $Al_{x3}Ga_{1-x3}N$, said current blocking layer is made of $Al_{x4}Ga_{1-x4}N$, and said x1, said x2, said x3 and said x4 are at least zero and not more than 1 respectively.

15. The semiconductor laser device according to claim 1, wherein said active layer includes a layer made of $(Al_{x1}Ga_{1-x1})_{y1}In_{1-y1}P$, said depletion enhancement layer is made of $(Al_{x2}Ga_{1-x2})_{y2}In_{1-y2}P$, said low carrier concentration layer is made of $Al_{x3}Ga_{1-x3}As$, said current blocking layer is made of $Al_{x4}Ga_{1-x4}As$, said x1, said x2, said x3, said x4, said y1 and said y2 are at least zero and not more than 1 respectively. and said first conduction type is the p type, and said second conduction type is the n type.

16. A semiconductor laser device comprising:

an active layer;

a first cladding layer of a first conduction type provided on said active layer;

a first current blocking layer provided on said first cladding layer except a current injection region, said first current blocking layer having a carrier concentration;

a second current blocking layer of a second conduction type provided on said first current blocking layer, said second current blocking layer having a carrier concentration; and a depletion enhancement layer formed between said first cladding layer and said first current blocking layer for inhibiting storage of carriers in said first current blocking layer, wherein said depletion enhancement layer has a thickness of at least 10 nm, and has an energy level in band gap supplying second conduction type carriers to compensate for first conduction type carriers supplied from said first cladding layer due to a modulation doping effect; and further wherein the first current blocking layer has a lower carrier concentration than the second current blocking layer.

17. The semiconductor laser device according to claim 16, wherein said first current blocking layer has a narrower band gap than said first cladding layer.

18. The semiconductor laser device according to claim 16, wherein said energy level in band gap has such density that substantially all said band-to-band levels ionize under a condition applying no bias voltage.

19. The semiconductor laser device according to claim 16, wherein said energy level in band gap is formed by doping with a second conduction type impurity.

20. The semiconductor lasor device according to claim 16, wherein the material of said depletion enhancement layer is the same as the material of said first current blocking layer.

21. The semiconductor laser device according to claim 16, wherein said first cladding layer has a larger band gap than said depletion enhancement layer, said semiconductor laser device further comprising an intermediate band gap layer provided between said first cladding layer and said depletion enhancement layer and having a band gap smaller than the band gap of said first cladding layer and larger than the band gap of said depletion enhancement layer.

22. The semiconductor laser device according to claim 16, wherein said depletion enhancement layer has a bend gap smaller than the band gap of said first cladding layer and larger than the band gap of said first current blocking layer.

23. The semiconductor loser device according to claim 16, wherein said first cladding layer has a flat portion formed on said active layer and a ridge portion formed on a portion or said flat portion in said current injection region, said depletion enhancement layer is provided on said flat portion located on both sides of said ridge portion and on the side surfaces of said ridge portion, and said first current blocking layer is formed on said depletion enhancement layer.

24. The semiconductor laser device according to claim 16, wherein said depletion enhancement layer and said first current blocking layer are successively formed on said first cladding layer except said current injection region, said semiconductor laser device further comprising a second cladding layer of a first conduction type provided to fill up a space enclosed with the side surfaces of said depletion enhancement layer and said first current blocking layer and the upper surface of said first cladding layer in said current injection region.

25. The semiconductor laser device according to claim 16, wherein said depletion enhancement layer is formed on a region excluding said current injection region.

* * * * *